(12) United States Patent
Bang et al.

(10) Patent No.: US 9,660,099 B2
(45) Date of Patent: May 23, 2017

(54) THIN FILM TRANSISTOR SUBSTRATE AND METHOD OF MANUFACTURING THE SAME

(71) Applicant: SAMSUNG DISPLAY CO., LTD., Yongin-si, Gyeonggi-Do (KR)

(72) Inventors: Seok-Hwan Bang, Seongnam-si (KR); Hyung-Jun Kim, Yongin-si (KR); Ji-Man Lim, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/920,741

(22) Filed: Oct. 22, 2015

(65) Prior Publication Data

US 2017/0117415 A1    Apr. 27, 2017

(30) Foreign Application Priority Data

Dec. 5, 2014 (KR) .......................... 10-2014-0174127

(51) Int. Cl.
| | | |
|---|---|---|
| *H01L 29/78* | (2006.01) | |
| *H01L 29/66* | (2006.01) | |
| *H01L 29/786* | (2006.01) | |
| *H01L 29/423* | (2006.01) | |
| *H01L 21/02* | (2006.01) | |

(52) U.S. Cl.
CPC .... *H01L 29/7869* (2013.01); *H01L 21/02252* (2013.01); *H01L 29/42384* (2013.01); *H01L 29/66969* (2013.01); *H01L 29/78606* (2013.01)

(58) Field of Classification Search
CPC .......... H01L 29/7869; H01L 29/42384; H01L 29/66969; H01L 29/78606
See application file for complete search history.

(56) References Cited

U.S. PATENT DOCUMENTS

| | | | | |
|---|---|---|---|---|
| 6,545,295 B2 * | 4/2003 | Batey | ................ | H01L 21/28008 257/347 |
| 6,759,283 B2 * | 7/2004 | Yasuda | ............. | H01L 29/78609 257/66 |
| 6,762,081 B2 * | 7/2004 | Yamazaki | ........... | H01L 27/1281 257/E21.413 |

(Continued)

FOREIGN PATENT DOCUMENTS

| | | |
|---|---|---|
| JP | 2011-142309 A | 7/2011 |
| KR | 10-2012-0122518 A | 11/2012 |

(Continued)

OTHER PUBLICATIONS

Partial European Search Report for European Patent Application No. 15197918.4, European Patent Office, May 4, 2016, 6 pages, Berlin, Germany.

*Primary Examiner* — Ida M Soward

(57) ABSTRACT

A thin film transistor substrate includes a gate electrode disposed on a base substrate, an active pattern overlapping the gate electrode, a source metal pattern including both a source electrode disposed on the active pattern and a drain electrode spaced apart from the source electrode, a buffer layer disposed on the source metal pattern and contacting the active pattern, a first passivation layer disposed on the buffer layer and a second passivation layer disposed on the first passivation layer. The density of hydrogen in the buffer layer is greater than the density of hydrogen in the first passivation layer and less than the density of hydrogen in the second passivation layer.

8 Claims, 29 Drawing Sheets

(56) References Cited

U.S. PATENT DOCUMENTS

| | | | |
|---|---|---|---|
| 7,450,200 B2* | 11/2008 | Park | G02F 1/136227 |
| | | | 349/114 |
| 8,420,553 B2 | 4/2013 | Yamazaki | |
| 8,742,418 B2* | 6/2014 | Morosawa | H01L 29/7869 |
| | | | 257/410 |
| 9,218,082 B2* | 12/2015 | Oh | G02F 1/13338 |
| 9,224,871 B2* | 12/2015 | Maeda | H01L 29/78696 |
| 9,245,957 B2* | 1/2016 | Kim | H01L 29/7869 |
| 9,335,601 B2* | 5/2016 | Seo | H01L 29/4908 |
| 9,502,492 B2* | 11/2016 | Terai | H01L 28/60 |
| 2005/0218794 A1* | 10/2005 | Seo | H01L 51/5271 |
| | | | 313/504 |
| 2010/0283049 A1 | 11/2010 | Sato et al. | |
| 2011/0127518 A1 | 6/2011 | Jung et al. | |
| 2015/0053970 A1* | 2/2015 | Lee | H01L 27/1225 |
| | | | 257/43 |
| 2015/0162393 A1* | 6/2015 | Kang | G01R 31/2635 |
| | | | 324/762.07 |
| 2015/0279872 A1* | 10/2015 | Kato | H01L 27/1255 |
| | | | 257/43 |
| 2016/0064465 A1* | 3/2016 | Oh | H01L 27/3262 |
| | | | 257/43 |
| 2016/0093744 A1* | 3/2016 | Sugawara | H01L 29/7869 |
| | | | 257/43 |
| 2016/0124280 A1* | 5/2016 | Park | G02F 1/136286 |
| | | | 349/43 |
| 2016/0147124 A1* | 5/2016 | Su | G02F 1/136286 |
| | | | 257/72 |

FOREIGN PATENT DOCUMENTS

| | | | |
|---|---|---|---|
| KR | 10-2014-0055919 A | 5/2014 | |
| KR | 10-2014-0056862 A | 5/2014 | |

* cited by examiner

THIN FILM TRANSISTOR SUBSTRATE AND METHOD OF MANUFACTURING THE SAME

CROSS-REFERENCE TO RELATED APPLICATIONS

This application claims priority under 35 U.S.C. §119 to Korean Patent Application No. 10-2014-0174127 filed on Dec. 5, 2014 in the Korean Intellectual Property Office, the contents of which are herein incorporated by reference in their entireties.

BACKGROUND

1. Field

Exemplary embodiments of the present inventive concept relate generally to thin film transistors. More particularly, exemplary embodiments relate to thin film transistor substrates that may be used for display devices, and methods of their manufacture.

2. Description of the Related Art

Generally, a thin film transistor for driving a pixel unit in a display device includes a gate electrode, a source electrode, a drain electrode, and an active pattern forming a channel between the source electrode and the drain electrode. The active pattern includes a semiconductor layer including amorphous silicon, polycrystalline silicon, an oxide semiconductor, or the like.

Amorphous silicon has a relatively low electron mobility, which may be about 1 to about 10 $cm^2/V$, so that an amorphous silicon thin film transistor has relatively low driving characteristics. In contrast, polycrystalline silicon has a relatively high electron mobility, which may be about 10 to about hundreds of $cm^2/V$. However, a crystallization process is required for forming polycrystalline silicon. Thus, it is difficult to form a uniform polycrystalline silicon layer on a large-sized substrate, and resulting manufacturing costs are high. Oxide semiconductors may be formed through a low-temperature process that is relatively easily scaled up, and have a high electron mobility. Thus, research is actively being conducted on thin film transistors which include an oxide semiconductor.

However, when a passivation layer is formed using plasma treating, ionized atoms may impact the oxide semiconductors. This may generate defects within the oxide semiconductors. This in turn may manifest as defects in the display apparatus.

SUMMARY

Exemplary embodiments of the present inventive concept provide a thin film transistor substrate having fewer defects.

Exemplary embodiments of the present inventive concept further provide a method of manufacturing the thin film transistor substrate.

In an exemplary embodiment of a thin film transistor substrate according to the present inventive concept, the thin film transistor substrate includes a gate electrode disposed on a base substrate, an active pattern overlapping the gate electrode, a source metal pattern comprising both a source electrode disposed on the active pattern and a drain electrode spaced apart from the source electrode, a buffer layer disposed on the source metal pattern and contacting the active pattern, a first passivation layer disposed on the buffer layer and a second passivation layer disposed on the first passivation layer. The density of hydrogen in the buffer layer is greater than the density of hydrogen in the first passivation layer and less than the density of hydrogen in the second passivation layer.

In an exemplary embodiment, the buffer layer may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

In an exemplary embodiment, the buffer layer may include a first sub buffer layer contacting the active pattern, a second sub buffer layer disposed on the first sub buffer layer and a third sub buffer layer disposed on the second sub buffer layer and contacting the first passivation layer.

In an exemplary embodiment, the density of hydrogen contained in the first sub buffer layer may be greater than the density of hydrogen in the second sub buffer layer. The density of hydrogen in the second sub buffer layer may be greater than the density of hydrogen in the third sub buffer layer.

In an exemplary embodiment, the first sub buffer layer, the second sub buffer layer and the third sub buffer layer may each include the same material.

In an exemplary embodiment, the first sub buffer layer, the second sub buffer layer, the third sub buffer layer and the first passivation layer may each include the same material.

In an exemplary embodiment, the thin film transistor substrate may further include an insulation layer disposed on the gate electrode and a lower buffer layer disposed between the insulation layer and the active pattern.

In an exemplary embodiment, the density of hydrogen in the lower buffer layer may be greater than the density of hydrogen in the first passivation layer.

In an exemplary embodiment of a method of manufacturing a thin film transistor substrate according to the present inventive concept, the method includes forming a gate electrode on a base substrate, forming an insulation layer on the gate electrode, forming an active pattern on the insulation layer, forming a metal pattern on the active pattern, the metal pattern comprising a source electrode and a drain electrode spaced apart from the source electrode on the active pattern, forming a buffer layer on the source metal pattern, forming a first passivation layer on the buffer layer and forming a second passivation layer on the first passivation layer. The forming a buffer layer includes performing a plasma treatment using a first electric power. The forming a first passivation layer includes performing a plasma treatment using a second electric power higher than the first electric power. The forming a second passivation layer includes performing a plasma treatment using a third electric power higher than the second electric power.

In an exemplary embodiment, the first electric power may be greater than 0.5 kW and less than 1.5 kW. The second electric power may be greater than 3.5 kW and less than 4.5 kW. The third electric power may be greater than 7.5 kW and less than 8.5 kW.

In an exemplary embodiment, a density of hydrogen in the buffer layer may be greater than the density of hydrogen in the first passivation layer and less than the density of hydrogen in the second passivation layer.

In an exemplary embodiment, the buffer layer may include silicon oxide (SiOx), aluminum oxide (AlOx), gallium oxide (GaOx), titanium oxide (TiOx), tantalum oxide (TaOx), manganese oxide (MnOx), silicon oxynitride (SiON), aluminum oxynitride (AlON) or gallium oxynitride (GaON).

In an exemplary embodiment, the forming a buffer layer may further include forming a first sub buffer layer on the active pattern, forming a second sub buffer layer on the first sub buffer layer and forming a third sub buffer layer on the second sub buffer layer. The forming a first passivation layer may further comprise forming the first passivation layer so as to contact the third sub buffer layer.

In an exemplary embodiment, the forming a third sub buffer layer may include performing a plasma treatment using a first electric power. The forming a second sub buffer layer may include performing a plasma treatment using a fourth electric power lower than the first electric power. The forming a first sub buffer layer may include performing a plasma treatment using a fifth electric power lower than the fourth electric power.

In an exemplary embodiment, a density of hydrogen in the first sub buffer layer may be greater than the density of hydrogen contained in the second sub buffer layer. The density of hydrogen in the second sub buffer layer may be greater than the density of hydrogen in the third sub buffer layer.

In an exemplary embodiment, the first sub buffer layer, the second sub buffer layer and the third sub buffer layer may each include the same material.

In an exemplary embodiment, the first sub buffer layer, the second sub buffer layer, the third sub buffer layer and the first passivation layer may each include the same material.

In an exemplary embodiment, the method may further include forming a lower buffer layer on the insulation layer.

In an exemplary embodiment, the forming a lower buffer layer may include performing a plasma treatment using the first electric power.

In an exemplary embodiment, a density of hydrogen in the lower buffer layer may be greater than the density of hydrogen in the first passivation layer.

According to exemplary embodiments, a buffer layer is formed by using a relatively low electric power, so that deterioration of the active pattern and the source metal pattern may be minimized. In addition, when the buffer layer includes silicon oxide (SiOx) and is formed using a low electric power, $H_2SiOx$ may be generated. Thus, an amount, or density, of hydrogen in the buffer layer may be increased. Accordingly, oxygen may be provided to the active pattern, so that carriers may be increased in the active pattern.

In addition, a thin film transistor substrate according to an exemplary embodiment of the inventive concept further includes a lower buffer layer disposed between the gate insulation layer and the active pattern. Accordingly, the lower buffer layer provides the active pattern with oxygen, so that carriers may be further increased in the active pattern.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, the present invention will be explained in detail with reference to the accompanying drawings. The drawings are not to scale. All numerical values are approximate, and may vary. All examples of specific materials and compositions are to be taken as nonlimiting and exemplary only. Other suitable materials and compositions may be used instead.

Figure 1:
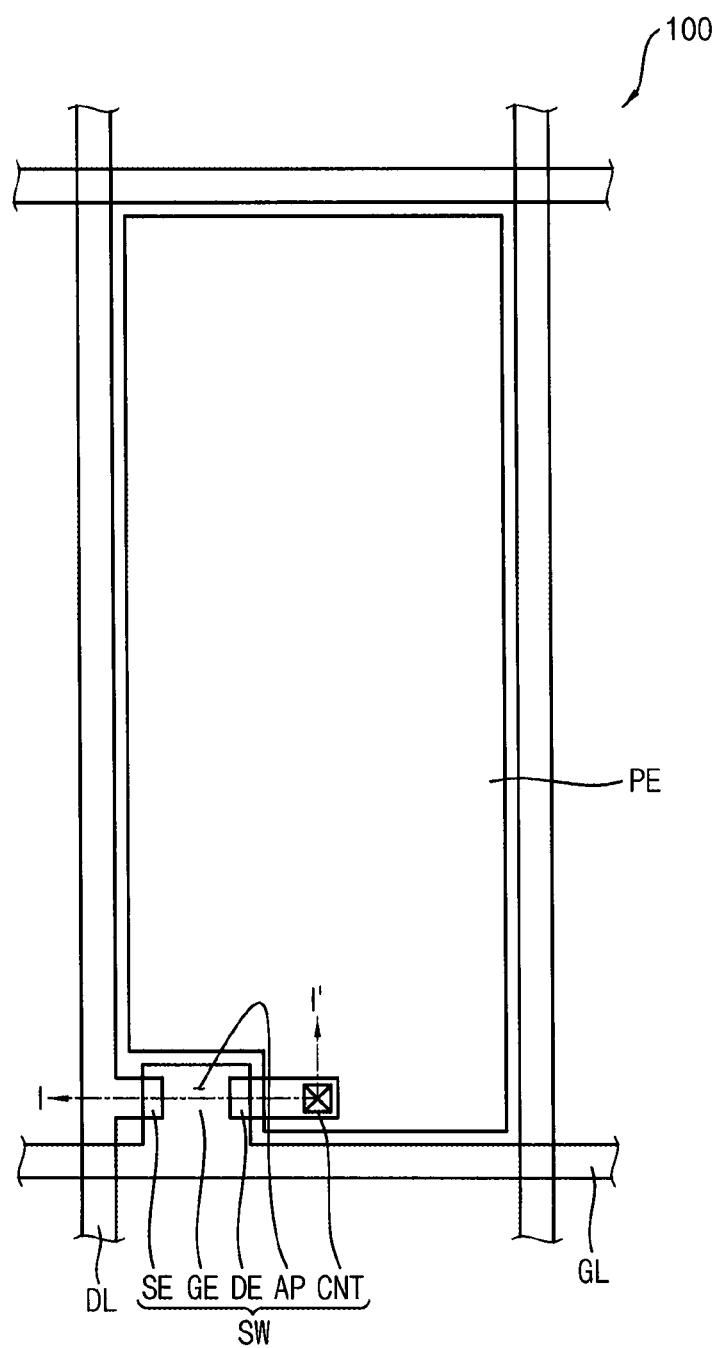
FIG. 1 is a plan view illustrating a thin film transistor substrate according to an exemplary embodiment of the inventive concept.
Figure 2:
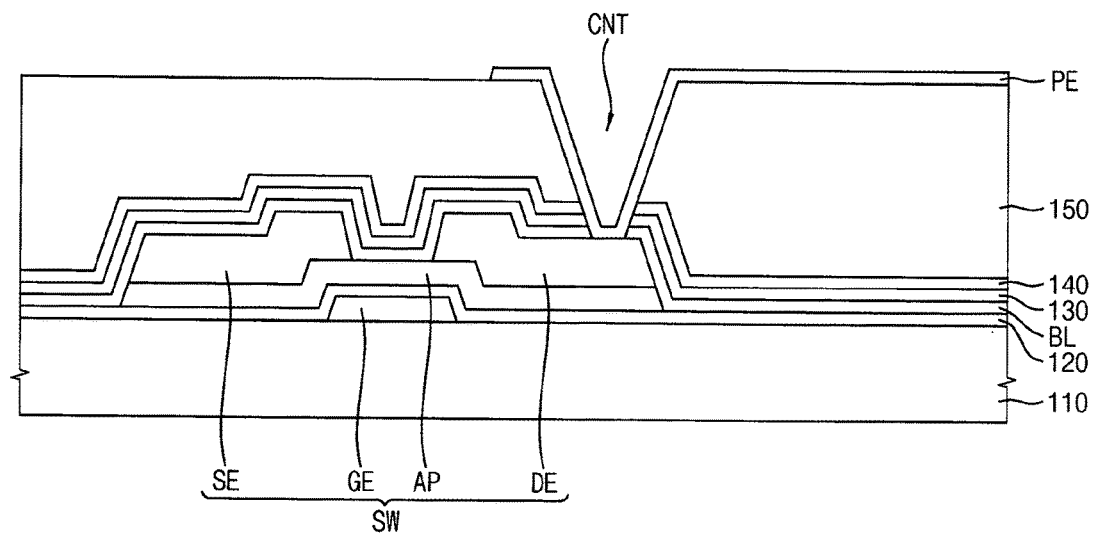
FIG. 2 is a cross-sectional view taken along line I-I' of FIG. 1.

FIG. 1 is a plan view illustrating a thin film transistor substrate according to an exemplary embodiment of the inventive concept. FIG. 2 is a cross-sectional view taken along line IT of FIG. 1.

Referring to FIGS. 1 and 2, a thin film transistor substrate according to an exemplary embodiment of the present inventive concept includes a gate line GL, a data line DL crossing the gate line GL, a thin film transistor SW which is a switching element, and a pixel electrode PE. The thin film transistor SW may be electrically connected to the gate line GL and the data line DL. The pixel electrode PE may be electrically connected to the thin film transistor SW through a contact hole CNT.

The gate line GL extends in a first direction D1. The gate line GL may have a single layer structure including copper (Cu), silver (Ag), chrome (Cr), molybdenum (Mo), aluminum (Al), titanium (Ti), manganese (Mn) or a mixture thereof. Alternatively, the gate line GL may have a multilayer structure having a plurality of layers with materials different from each other. For example, the gate line GL may include a copper layer and a titanium layer disposed on and/or under the copper layer. The gate line GL is electrically connected to a gate electrode GE of the thin film transistor SW. In addition, portions of the gate line GL may form the gate electrode GE.

A gate insulation layer 120 is formed on the gate line GL and the gate electrode GE. The gate insulation layer 120 may include an inorganic material such as silicon oxide (SiOx) and/or silicon nitride (SiNx). For example, the gate insulation layer 120 can include silicon oxide (SiOx), and may have a thickness of about 500 Å. In addition, the gate insulation layer 120 may include a plurality of layers with materials that are different from each other.

An active pattern AP is formed on the gate insulation layer 120. The active pattern AP includes an oxide semiconductor. For example, the oxide semiconductor may include any one or more of zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

A buffer layer BL is formed on the source metal pattern. The buffer layer BL may include an inorganic material such as silicon oxide (SiOx) and/or silicon nitride (SiNx). For example, the buffer layer BL may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The buffer layer BL may be formed by using a plasma treating process. For example, the buffer layer BL may be formed via a plasma treating process with an electric power of more than 0.5 kW and less than 1.5 kW. Preferably, the buffer layer BL may be formed using an electric power of 1.0 kW. When the buffer layer BL includes silicon oxide (SiOx) and is formed using a low electric power, $H_2SiOx$ may be generated. For example, SiO2 is formed by chemical reaction between SiH4 and N2O. However, when the chemical reaction between SiH4 and N2O is performed by using a low electric power, chemical bond between Si and H is not break completely. Accordingly, $H_2SiOx$ may be generated. Thus, the quantity of hydrogen in the buffer layer BL may be increased. Since the buffer layer BL is formed using a relatively low electric power, deterioration of the active pattern AP and the source metal pattern may be minimized.

In addition, oxygen may be provided to the active pattern AP, so that carriers may be increased in the active pattern AP.

A first passivation layer 130 is formed on the buffer layer BL. The first passivation layer 130 may include an inorganic material such as silicon oxide (SiOx) and/or silicon nitride (SiNx). For example, the first passivation layer 130 can include silicon oxide (SiOx), and may have a thickness of about 500 Å. In addition, the first passivation layer 130 may include a plurality of layers of different materials.

The first passivation layer 130 may be formed using a plasma treating process. This process may use an electric power of more than 3.5 kW and less than 4.5 kW. Preferably, the first passivation layer 130 may be formed using an electric power of 4.0 kW. A quantity of hydrogen contained in the buffer layer BL is more than the quantity of hydrogen contained in the first passivation layer 130.

A second passivation layer 140 is formed on the first passivation layer 130. The second passivation layer 140 may include an inorganic material such as silicon oxide (SiOx) and/or silicon nitride (SiNx). For example, the second passivation layer 140 can include silicon oxide (SiOx), and may have a thickness of about 500 Å. In addition, the second passivation layer 140 may include a plurality of layers of differing materials.

The second passivation layer 140 may be formed using a process such as plasma treating. For example, the second passivation layer 140 may be formed using a plasma treatment process with an electric power of more than 7.5 kW and less than 8.5 kW. Preferably, the second passivation layer 140 may be formed using an electric power of 7.7 kW. The quantity of hydrogen contained in the buffer layer BL is less than the quantity of hydrogen contained in the second passivation layer 140.

An organic layer 150 is formed on the second passivation layer 140. The organic layer 150 planarizes an upper surface of the thin film transistor substrate 100 so that problems due to step differences in height, such as disconnection of a signal line, may be prevented. The organic layer 150 may be an insulation layer including an organic material. For example, the organic layer 150 may be a color filter layer. When the organic layer 150 is a color filter layer, the color filter layer may be a color filter layer having any color, such as a red color, a green color, a blue color or a white color.

A pixel electrode PE is formed on the organic layer 150. The pixel electrode PE may include a transparent conductive material, such as indium tin oxide (ITO) and/or indium zinc oxide (IZO). In addition, the pixel electrode PE may include titanium (Ti) and/or molybdenum titanium (MoTi). The pixel electrode PE may be electrically connected to the drain electrode DE. The pixel electrode PE may be electrically connected to the drain electrode DE through the contact hole CNT.

FIGS. 3 to 7 are cross-sectional views illustrating a method of manufacturing the thin film transistor substrate of FIG. 2. FIG. 8 is a graph illustrating electric power use in a method of manufacturing the thin film transistor substrate of FIG. 2.

Figure 3:
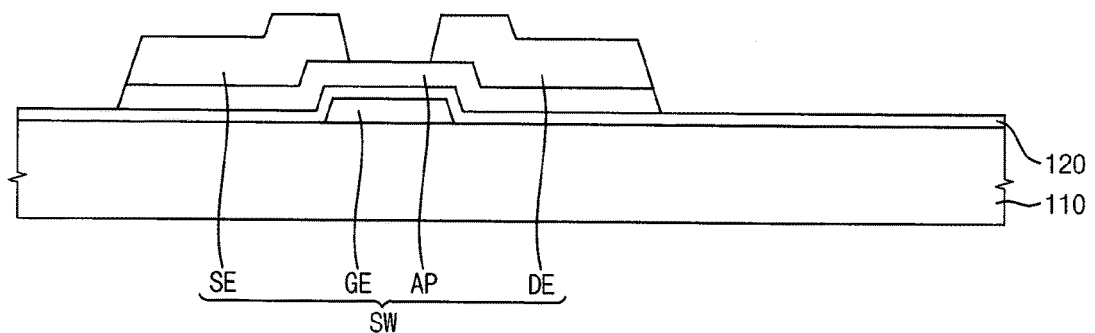
FIGS. 3 to 7 are cross-sectional views illustrating a method of manufacturing the thin film transistor substrate of FIG. 2.

Referring to FIG. 3, a gate electrode GE, a gate insulation layer 120, an active pattern AP, a source electrode SE and a drain electrode DE are formed on a base substrate 110.

A gate metal pattern including the gate electrode GE is formed on the base substrate 110. The gate metal pattern may further include a gate line GL electrically connected to the gate electrode GE.

A gate metal layer is patterned to form the gate line GL and the gate electrode GE, after the gate metal layer is formed on the base substrate 110. The base substrate 110 may be made of a transparent material. Examples of the base substrate 110 may include a glass substrate, a quartz substrate, a silicon substrate, a plastic substrate or the like.

The gate metal layer may have a single layer structure including, for example, copper (Cu), silver (Ag), chrome (Cr), molybdenum (Mo), aluminum (Al), titanium (Ti), manganese (Mn) or a mixture thereof. In addition, the gate metal layer may have a multilayer structure having a plurality of layers of different materials. For example, the gate metal layer may include a copper layer and a titanium layer disposed on and/or under the copper layer.

A gate insulation layer 120 is formed on the gate line GL and the gate electrode GE. The gate insulation layer 120 may include an inorganic material such as silicon oxide (SiOx) and/or silicon nitride (SiNx). For example, the gate insulation layer 120 can include silicon oxide (SiOx). In addition, the gate insulation layer 120 may include a plurality of layers of different materials.

An active pattern AP is formed on the gate insulation layer 120. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used each alone or in any combination. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

Figure 4:
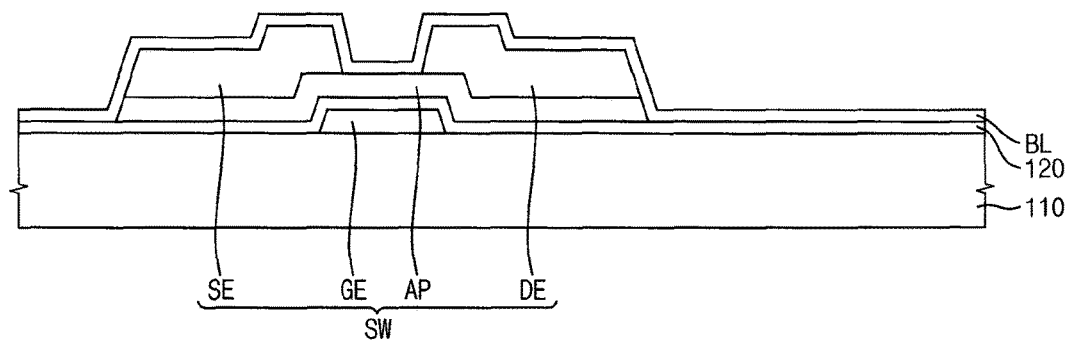

Referring to FIG. 4, a buffer layer BL is formed on the source electrode SE and the drain electrode DE.

The buffer layer BL may be formed by using a plasma treatment process. For example, the buffer layer BL may be formed using a plasma treatment process with an electric power of more than 0.5 kW and less than 1.5 kW. Preferably, the buffer layer BL may be formed using an electric power of 1.0 kW. When the buffer layer BL includes silicon oxide (SiOx) and is formed using a low electric power, $H_2SiOx$ may be generated. Thus, the quantity of hydrogen in the buffer layer BL may be increased. Since the buffer layer BL is formed using a relatively low electric power, deterioration of the active pattern AP and the source metal pattern may be minimized. In addition, oxygen may be provided to the active pattern AP, so that carriers may be increased in the active pattern AP.

The buffer layer BL may include an inorganic material such as silicon oxide (SiOx) and/or silicon nitride (SiNx). For example, the buffer layer BL may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

Figure 5:
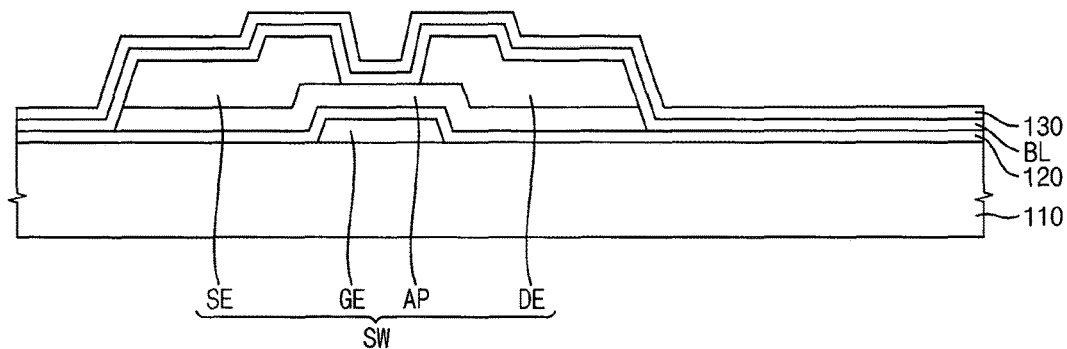

Referring to FIG. 5, a first passivation layer 130 is formed on the buffer layer BL.

The first passivation layer 130 may be formed using a plasma treatment process. For example, the first passivation layer 130 may be formed via a plasma treatment process with an electric power of more than 3.5 kW and less than 4.5 kW. Preferably, the first passivation layer 130 may be formed using an electric power of 4.0 kW. The quantity of hydrogen contained in the buffer layer BL is greater than the quantity of hydrogen contained in the first passivation layer 130.

The first passivation layer 130 may include an inorganic material such as silicon oxide (SiOx) and/or silicon nitride (SiNx). For example, the first passivation layer 130 can include silicon oxide (SiOx), and may have a thickness of about 500 Å. In addition, the first passivation layer 130 may include a plurality of layers of different materials.

Figure 6:
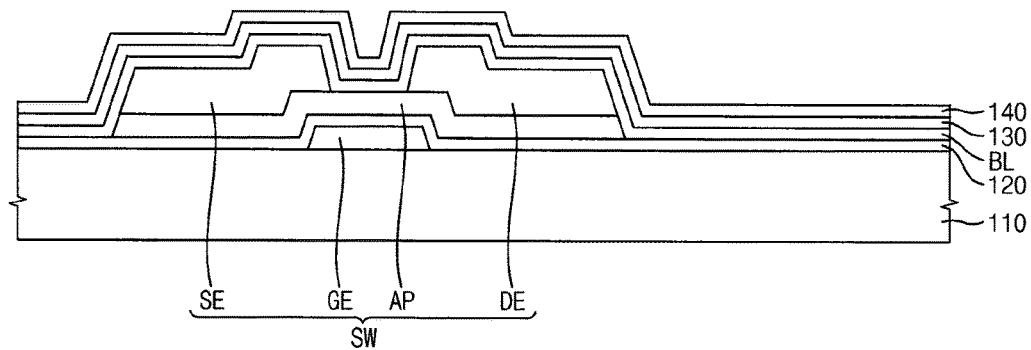

Referring to FIG. 6, a second passivation layer 140 is formed on the first passivation layer 130.

The second passivation layer 140 may be formed using a plasma treatment process. For example, the second passivation layer 140 may be formed via a plasma treatment process with an electric power of more than 7.5 kW and less than 8.5 kW. Preferably, the second passivation layer 140 may be formed using an electric power of 7.7 kW. The quantity of hydrogen contained in the buffer layer BL is less than the quantity of hydrogen contained in the second passivation layer 140.

The second passivation layer 140 may include an inorganic material such as silicon oxide (SiOx) and/or silicon nitride (SiNx). For example, the second passivation layer 140 may include silicon oxide (SiOx), and may have a thickness of about 500 Å. In addition, the second passivation layer 140 may include a plurality of layers of different materials.

Referring to FIG. 8, plasma electric power usage in forming the buffer layer BL, the first passivation layer 130 and the second passivation layer 140 is illustrated.

The buffer layer BL may be formed using an electric power of A kW. That is, the buffer layer BL may be formed using an electric power of A kW during a first time t1. For example, the first time t1 may be more than 5 seconds and less than 20 seconds. The electric power A may be 1.0 kW during this time t1.

The first passivation layer 130 may be formed using an electric power of B kW where B is higher than A. That is, the first passivation layer 130 may be formed using an electric power of B kW during a second time t2. For example, the second time t2 may be more than 5 seconds and less than 20 seconds. The power B may be 4.0 kW. The second passivation layer 140 may be formed using an electric power of C kW higher than B. That is, the second passivation layer 140 may be formed using an electric power of C kW during a third time t3. For example, the third time t3 may be more than 5 seconds and less than 20 seconds. The electric power C may be 7.7 kW.

Figure 7:
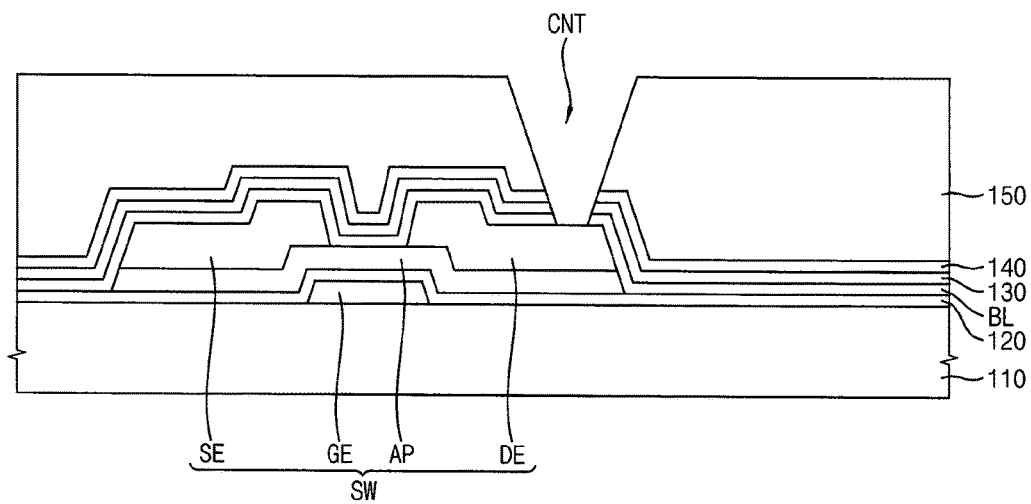
Figure 8:
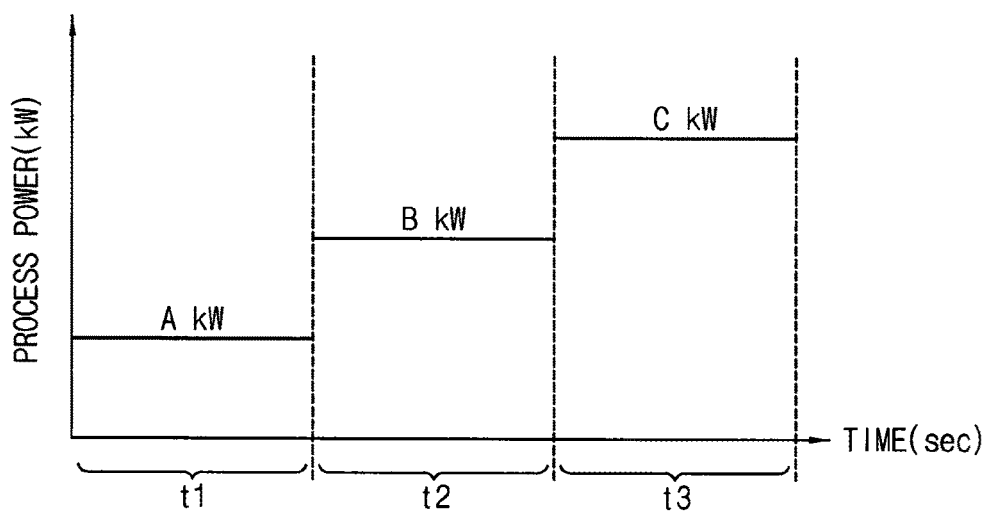
FIG. 8 is a graph illustrating electric power use in a method of manufacturing the thin film transistor substrate of FIG. 2.

Referring to FIG. 7, an organic layer 150 is formed on the base substrate 110 on which the second passivation layer 140 is formed. Thereafter, a contact hole CNT is formed through the buffer layer BL, the first passivation layer 130, the second passivation layer 140 and the organic layer 150.

The organic layer 150 planarizes an upper surface of the display substrate 100 so that problems due to step differences in the elevations of underlying layers, such as disconnection of a signal line, may be prevented. The organic layer 150 may be an insulation layer including an organic material. For example, the organic layer 150 may be a color filter layer. When the organic layer 150 is a color filter layer, the color filter layer may be a color filter layer having any color, such as a red color, a green color, a blue color or a white color.

A pixel electrode PE may be electrically connected to the drain electrode DE. The pixel electrode PE may be electrically connected to the drain electrode DE through the contact hole CNT.

Referring to FIG. 2, a transparent conductive layer is formed on the organic layer 150 and patterned to form a pixel electrode PE.

The transparent conductive layer may include a transparent conductive material, such as indium tin oxide (ITO) and/or indium zinc oxide (IZO). The pixel electrode PE may be electrically connected to the drain electrode DE through the contact hole CNT.

Since the buffer layer BL is formed using a relatively low electric power, deterioration of the active pattern AP and the source metal pattern may be reduced or minimized. In addition, when the buffer layer BL includes silicon oxide (SiOx) and is formed using a low electric power, $H_2SiOx$ may be generated. Thus, the quantity of hydrogen in the buffer layer BL may be increased. Accordingly, oxygen may be provided to the active pattern AP, so that carriers may be increased in the active pattern AP.

Figure 9:
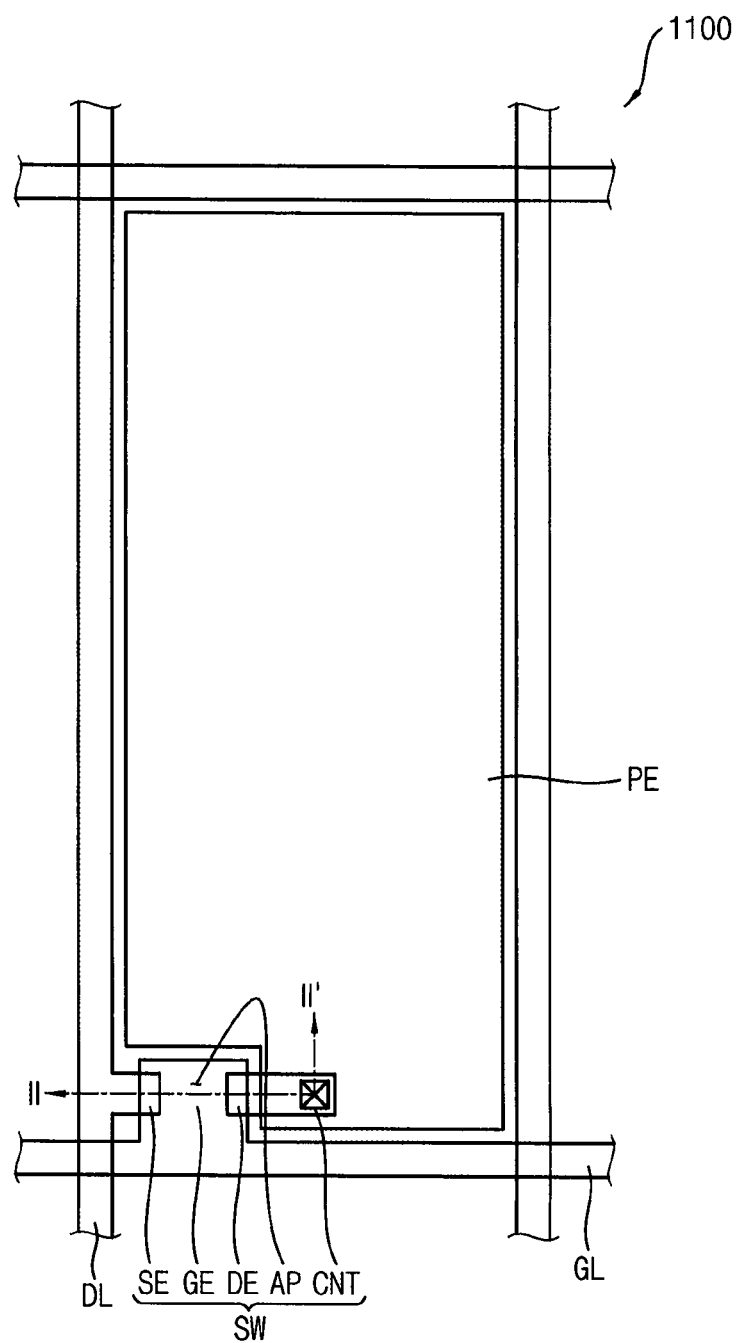
FIG. 9 is a plan view illustrating a thin film transistor substrate according to an exemplary embodiment of the inventive concept.
Figure 10:
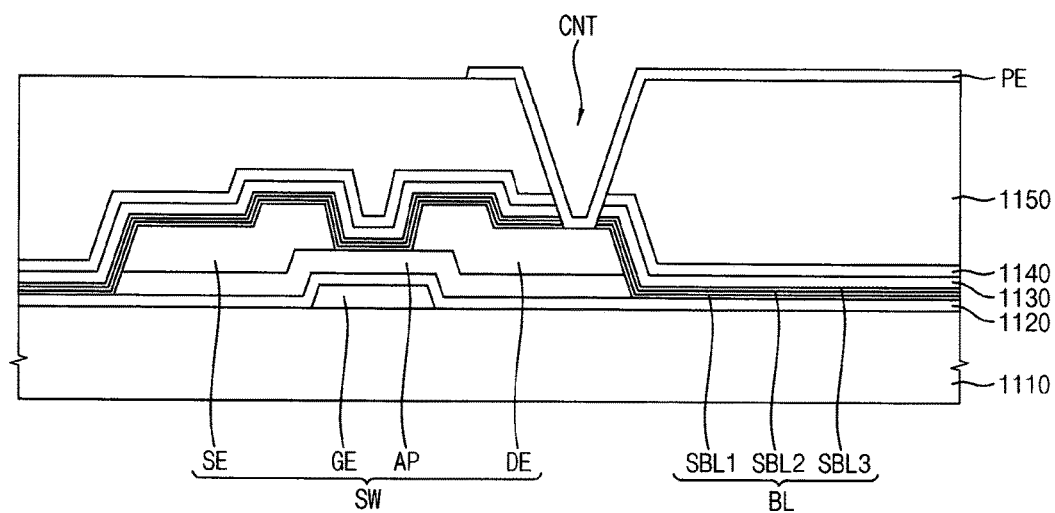
FIG. 10 is a cross-sectional view taken along line II-IF of FIG. 9.

FIG. 9 is a plan view illustrating a thin film transistor substrate according to an exemplary embodiment of the inventive concept. FIG. 10 is a cross-sectional view taken along line II-IF of FIG. 9.

Referring to FIGS. 9 and 10, a thin film transistor substrate according to an exemplary embodiment of the present inventive concept includes a gate line GL, a data line DL crossing the gate line GL, a thin film transistor SW which is a switching element, and a pixel electrode PE. The thin film transistor SW may be electrically connected to the gate line GL and the data line DL. The pixel electrode PE may be electrically connected to the thin film transistor SW through a contact hole CNT.

The gate line GL extends in a first direction D1. The gate line GL may have a single layer structure including copper (Cu), silver (Ag), chrome (Cr), molybdenum (Mo), aluminum (Al), titanium (Ti), manganese (Mn) or any mixture thereof. In addition, the gate line GL may have a multilayer structure having a plurality of layers of different materials. For example, the gate line GL may include a copper layer and a titanium layer disposed on and/or under the copper layer. The gate line GL is electrically connected to a gate electrode GE of the thin film transistor SW. In addition, portions of the gate line GL may form the gate electrode GE.

A gate insulation layer 1120 is formed on the gate line GL and the gate electrode GE. The gate insulation layer 1120 may include an inorganic material such as silicon oxide (SiOx) and/or silicon nitride (SiNx). For example, the gate insulation layer 1120 can include silicon oxide (SiOx), and may have a thickness of about 500 Å. In addition, the gate insulation layer 1120 may include a plurality of layers of different materials.

An active pattern AP is formed on the gate insulation layer 1120. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. Any one or more of these materials may be used. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

A buffer layer BL is formed on the source metal pattern. The buffer layer BL may include an inorganic material such as silicon oxide (SiOx) and/or silicon nitride (SiNx). For example, the buffer layer BL may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The buffer layer BL may be formed using a plasma treatment process. For example, the buffer layer BL may be formed via a plasma treatment process using an electric power of less than 1.5 kW. When the buffer layer BL includes silicon oxide (SiOx) and is formed using a low electric power, $H_2SiOx$ may be generated. Thus, the quantity of hydrogen in the buffer layer BL may be increased. Since the buffer layer BL is formed using a relatively low electric power, deterioration of the active pattern AP and the source metal pattern may be minimized. In addition, oxygen may be provided to the active pattern AP, so that carriers may be increased in the active pattern AP.

The buffer layer BL may include a first sub buffer layer SBL1, a second sub buffer layer SBL2 and a third sub buffer layer SBL3. The first sub buffer layer SBL1 contacts the active pattern AP. As one example, the first sub buffer layer SBL1 may be formed using a plasma treatment process with an electric power of more than 0.3 kW and less than 0.5 kW. Preferably, the first sub buffer layer SBL1 may be formed using an electric power of 0.4 kW. The second sub buffer layer SBL2 is disposed on the first sub buffer layer SBL1. As one example, the second sub buffer layer SBL2 may be formed using a plasma treatment process with an electric power of more than 0.6 kW and less than 0.8 kW. Preferably, the second sub buffer layer SBL2 may be formed using an electric power of 0.7 kW. The third sub buffer layer SBL3 contacts a first passivation layer 1130. As one example, the third sub buffer layer SBL3 may be formed using a plasma treatment process with an electric power of more than 0.9 kW and less than 1.2 kW. Preferably, the third sub buffer layer SBL3 may be formed using an electric power of 1.0 kW.

The quantity (i.e., density) of hydrogen contained in the first sub buffer layer SBL1 is greater than the quantity of hydrogen contained in the second sub buffer layer SBL2. The quantity of hydrogen contained in the second sub buffer layer SBL2 is greater than the quantity of hydrogen contained in the third sub buffer layer SBL3. The first sub buffer layer SBL1, the second sub buffer layer SBL2 and the third sub buffer layer SBL3 may each include the same material.

A first passivation layer 1130 is formed on the third sub buffer layer SBL3. The first passivation layer 1130 may include an inorganic material such as silicon oxide (SiOx) and/or silicon nitride (SiNx). For example, the first passivation layer 1130 can include silicon oxide (SiOx), and may have a thickness of about 500 Å. In addition, the first passivation layer 1130 may include a plurality of layers having different materials from each other.

The first passivation layer 1130 may be formed using a plasma treatment process. For example, the first passivation layer 1130 may be formed by a plasma treatment process using an electric power of more than 3.5 kW and less than 4.5 kW. Preferably, the first passivation layer 1130 may be formed using an electric power of 4.0 kW. The quantity of hydrogen contained in the buffer layer BL is greater than the quantity of hydrogen contained in the first passivation layer 1130.

A second passivation layer 1140 is formed on the first passivation layer 1130. The second passivation layer 1140 may include an inorganic material such as silicon oxide (SiOx) and/or silicon nitride (SiNx). For example, the second passivation layer 1140 may include silicon oxide (SiOx), and may have a thickness of about 500 Å. In addition, the second passivation layer 1140 may include a plurality of layers of different materials.

The second passivation layer 1140 may be formed using a plasma treatment process. For example, the second passivation layer 1140 may be formed by a plasma treatment process using an electric power of more than 7.5 kW and less than 8.5 kW. Preferably, the second passivation layer 1140 may be formed using an electric power of 7.7 kW. The quantity of hydrogen contained in the buffer layer BL is less than the quantity of hydrogen contained in the second passivation layer 1140.

An organic layer 1150 is formed on the second passivation layer 1140. The organic layer 1150 planarizes an upper surface of the thin film transistor substrate 1100 so that problems due to step differences in the elevation of the upper surface of the layers underlying layer 1150, such as disconnection of a signal line, may be prevented. The organic layer 1150 may be an insulation layer including an organic material. For example, the organic layer 1150 may a color filter layer. When the organic layer 1150 is a color filter layer, the color filter layer may be a color filter layer having any color, such as a red color, a green color, a blue color or a white color.

A pixel electrode PE is formed on the organic layer 1150. The pixel electrode PE may include a transparent conductive material, such as indium tin oxide (ITO) and/or indium zinc oxide (IZO). In addition, the pixel electrode PE may include titanium (Ti) and/or molybdenum titanium (MoTi). The pixel electrode PE may be electrically connected to the drain electrode DE. The pixel electrode PE may be electrically connected to the drain electrode DE through the contact hole CNT.

FIGS. 11 to 15 are cross-sectional views illustrating a method of manufacturing the thin film transistor substrate of FIG. 10. FIGS. 16A and 16B are graphs illustrating electric power used in a method of manufacturing the thin film transistor substrate of FIG. 10.

Figure 11:
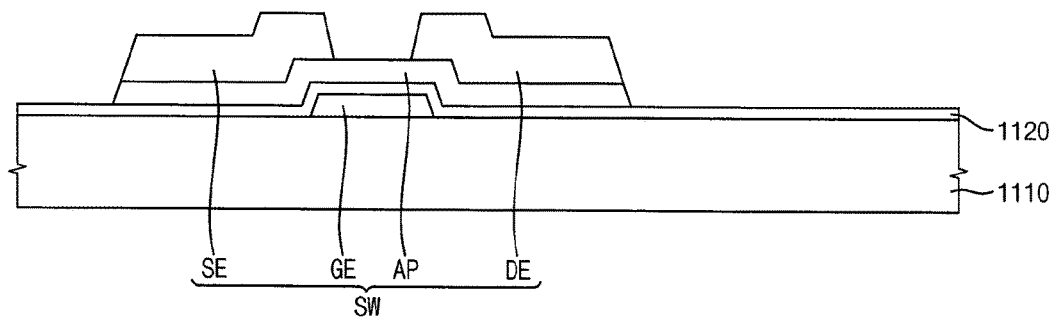
FIGS. 11 to 15 are cross-sectional views illustrating a method of manufacturing the thin film transistor substrate of FIG. 10.

Referring to FIG. 11, a gate electrode GE, a gate insulation layer 1120, an active pattern AP, a source electrode SE and a drain electrode DE are formed on a base substrate 1110.

A gate metal pattern including the gate electrode GE is formed on the base substrate 1110. The gate metal pattern may further include a gate line electrically connected to the gate electrode GE.

A gate metal layer is patterned to form the gate line and the gate electrode GE, after the gate metal layer is formed on the base substrate 1110. Examples of the base substrate 1110 may include a glass substrate, a quartz substrate, a silicon substrate, a plastic substrate or the like.

The gate metal layer may have a single layer structure including copper (Cu), silver (Ag), chrome (Cr), molybdenum (Mo), aluminum (Al), titanium (Ti), manganese (Mn) or some combination thereof. Alternatively, the gate metal layer may have a multilayer structure having a plurality of layers of different materials. For example, the gate metal layer may include a copper layer and a titanium layer disposed on and/or under the copper layer.

A gate insulation layer 1120 is formed on the gate line GL and the gate electrode GE. The gate insulation layer 1120 may include an inorganic material such as silicon oxide (SiOx) and/or silicon nitride (SiNx). For example, the gate insulation layer 1120 can include silicon oxide (SiOx). In addition, the gate insulation layer 1120 may include a plurality of layers of different materials.

An active pattern AP is formed on the gate insulation layer 1120. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used each alone or in any combination. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

Figure 12:
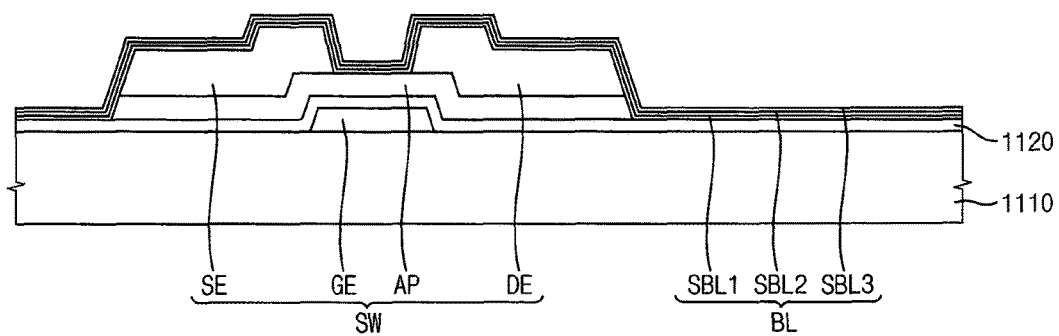

Referring to FIG. 12, a buffer layer BL is formed on the source electrode SE and the drain electrode DE. The buffer layer BL may include a first sub buffer layer SBL1, a second sub buffer layer SBL2 and a third sub buffer layer SBL3.

The buffer layer BL may be formed by using a plasma treatment process. For example, the buffer layer BL may be formed using a plasma treatment process at an electric power of less than 1.5 kW. When a silicon oxide (SiOx) buffer layer BL is formed using a low electric power, $H_2SiOx$ may be generated. Thus, the quantity of hydrogen in the buffer layer may be increased. Since the buffer layer BL is formed using a relatively low electric power, deterioration of the active pattern AP and the source metal pattern may be minimized. In addition, oxygen may be provided to the active pattern AP, so that carriers may be increased in the active pattern AP.

As above, the buffer layer BL may include a first sub buffer layer SBL1, a second sub buffer layer SBL2 and a third sub buffer layer SBL3. The first sub buffer layer SBL1 contacts the active pattern AP. As an example, the first sub buffer layer SBL1 may be formed by a plasma treatment process, using an electric power of more than 0.3 kW and less than 0.5 kW. Preferably, the first sub buffer layer SBL1 may be formed using an electric power of 0.4 kW. The second sub buffer layer SBL2 is disposed on the first sub buffer layer SBL1. As an example, the second sub buffer layer SBL2 may be formed by a plasma treatment process, using an electric power of more than 0.6 kW and less than 0.8 kW. Preferably, the second sub buffer layer SBL2 may be formed using an electric power of 0.7 kW. The third sub buffer layer SBL3 contacts a first passivation layer 1130. As an example, the third sub buffer layer SBL3 may be formed by a plasma treatment process using an electric power of more than 0.9 kW and less than 1.2 kW. Preferably, the third sub buffer layer SBL3 may be formed using an electric power of 1.0 kW.

The quantity or density of hydrogen contained in the first sub buffer layer SBL1 is greater than the quantity of hydrogen contained in the second sub buffer layer SBL2. The quantity of hydrogen contained in the second sub buffer layer SBL2 is greater than the quantity of hydrogen contained in the third sub buffer layer SBL3. The first sub buffer layer SBL1, the second sub buffer layer SBL2 and the third sub buffer layer SBL3 may each include the same material.

The buffer layer BL may include an inorganic material such as silicon oxide (SiOx) and/or silicon nitride (SiNx).

For example, the buffer layer BL may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

Figure 13:
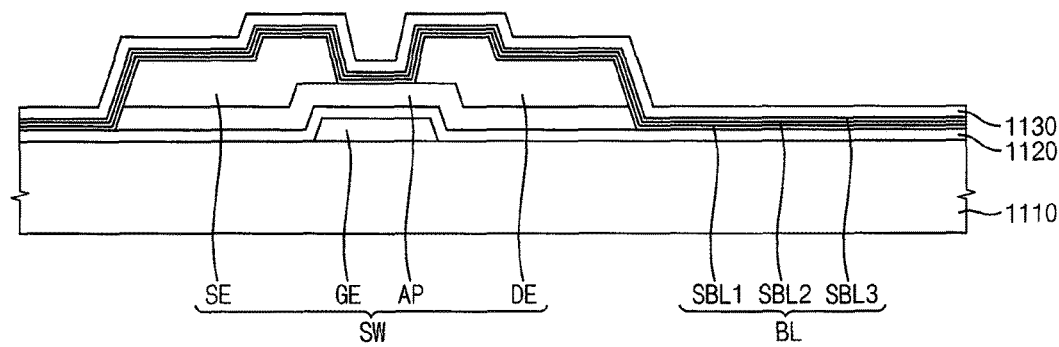

Referring to FIG. 13, a first passivation layer 1130 is formed on the buffer layer BL.

The first passivation layer 1130 may be formed using a plasma treatment process. For example, the first passivation layer 1130 may be formed by plasma treatment using an electric power of more than 3.5 kW and less than 4.5 kW. Preferably, the first passivation layer 1130 may be formed using an electric power of 4.0 kW. The quantity of hydrogen contained in the buffer layer BL is greater than the quantity of hydrogen contained in the first passivation layer 1130.

The first passivation layer 1130 may include an inorganic material such as silicon oxide (SiOx) and/or silicon nitride (SiNx). For example, the first passivation layer 1130 can include silicon oxide (SiOx), and may have a thickness of about 500 Å. In addition, the first passivation layer 1130 may include a plurality of layers of different materials.

Figure 14:
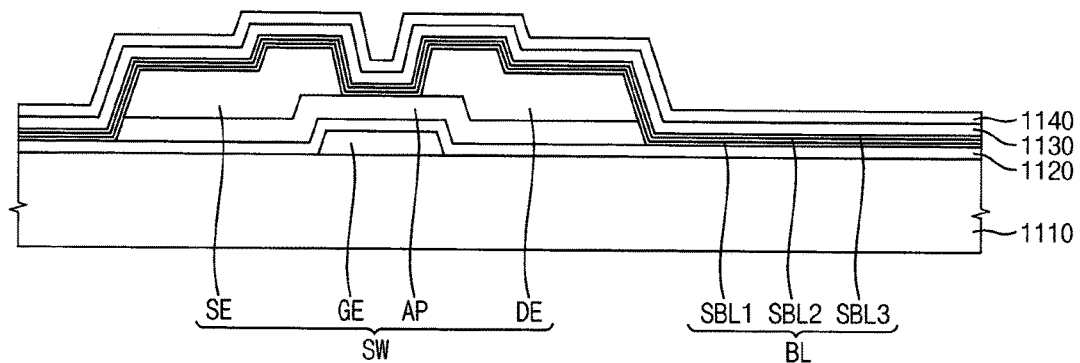

Referring to FIG. 14, a second passivation layer 1140 is formed on the first passivation layer 1130.

The second passivation layer 1140 may be formed using a plasma treatment process. For example, the second passivation layer 1140 may be formed by a plasma treatment process using an electric power of more than 7.5 kW and less than 8.5 kW. Preferably, the second passivation layer 1140 may be formed using an electric power of 7.7 kW. The quantity or density of hydrogen contained in the buffer layer BL is less than the quantity or density of hydrogen contained in the second passivation layer 1140.

The second passivation layer 1140 may include an inorganic material such as silicon oxide (SiOx) and/or silicon nitride (SiNx). For example, the second passivation layer 1140 includes silicon oxide (SiOx), and may have a thickness of about 500 Å. In addition, the second passivation layer 1140 may include a plurality of layers of different materials.

Referring to FIGS. 16A and 16B, plasma electric power levels used in forming the buffer layer BL, the first passivation layer 1130 and the second passivation layer 1140 are illustrated.

The buffer layer BL may be formed using an electric power of D kW, E kW and A kW. The buffer layer BL may include a first sub buffer layer SBL1, a second sub buffer layer SBL2 and a third sub buffer layer SBL3. The first sub buffer layer SBL1 may be formed using an electric power of D kW. The second sub buffer layer SBL2 may be formed using an electric power of E kW higher than the D kW. The third sub buffer layer SBL3 may be formed using an electric power of A kW higher than E. For example, A may be 1.0 kW.

The first passivation layer 1130 may be formed using an electric power of B kW higher than power level A. That is, the first passivation layer 1130 may be formed using an electric power of B kW during a second time t2. For example, the second time t2 may be more than 5 seconds and less than 20 seconds. The power level B may be 4.0 kW. The second passivation layer 1140 may be formed using an electric power of C kW higher than power level B. That is, the second passivation layer 1140 may be formed using an electric power of C kW during a third time t3. For example, the third time t3 may be more than 5 seconds and less than 20 seconds. The power level C may be 7.7 kW.

Figure 15:
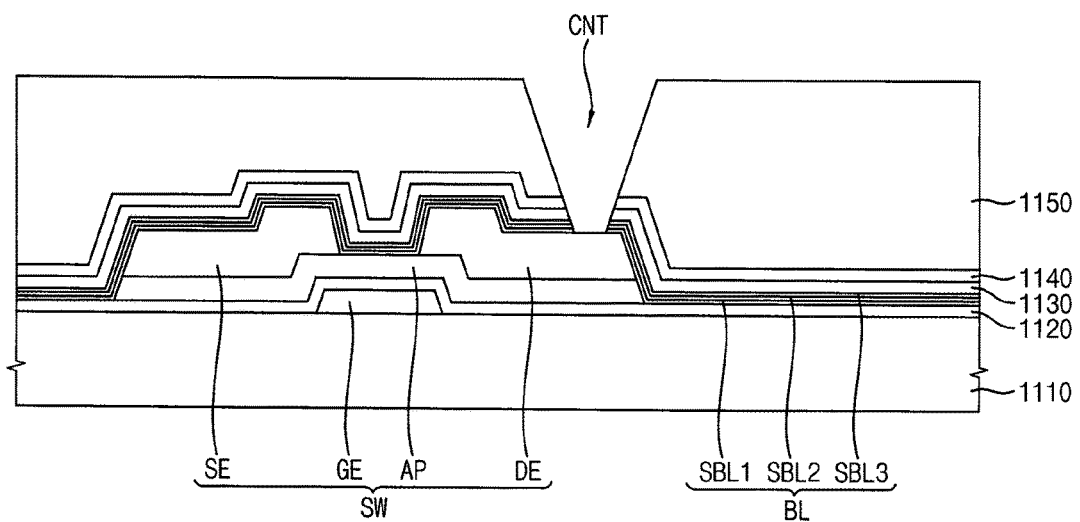
Figure 16A:
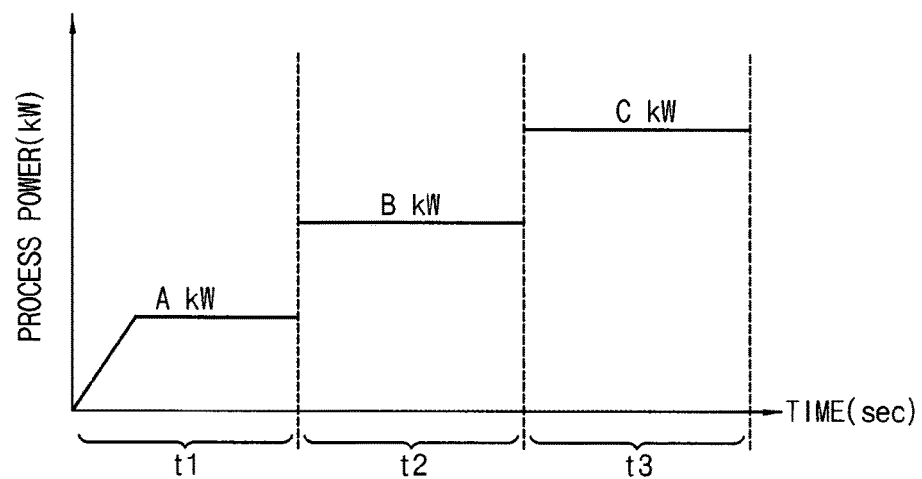
FIGS. 16A and 16B are graphs illustrating electric power use in a method of manufacturing the thin film transistor substrate of FIG. 10.
Figure 16B:
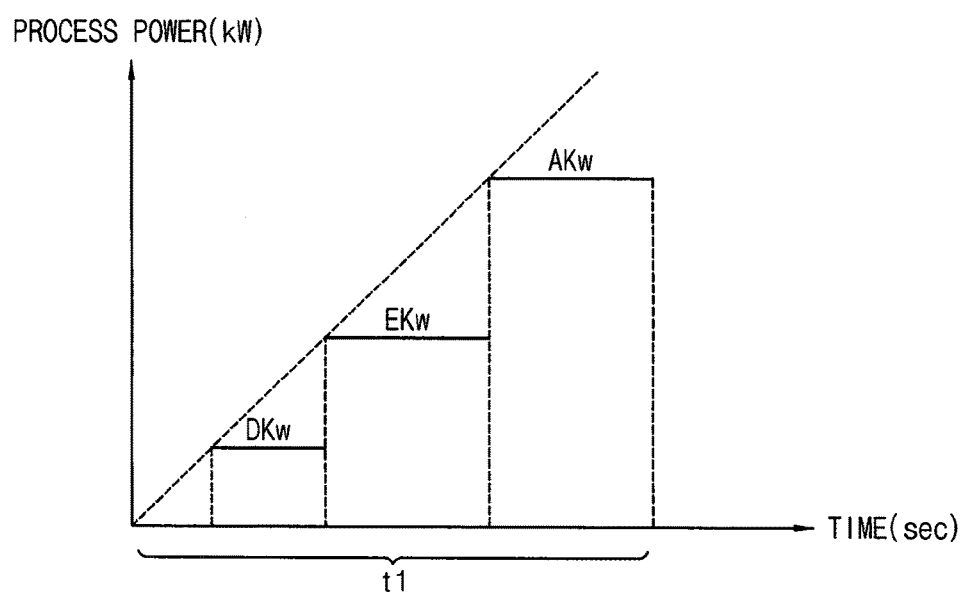

Referring to FIG. 15, an organic layer 1150 is formed on the second passivation layer 1140. Thereafter, a contact hole CNT is formed through the buffer layer BL, the first passivation layer 1130, the second passivation layer 1140 and the organic layer 1150.

The organic layer 1150 planarizes an upper surface of the display substrate 1100 so that problems due to step height differences in the upper surface of underlying layers, such as disconnection of a signal line, may be prevented. The organic layer 1150 may be an insulation layer including an organic material. For example, the organic layer 1150 may a color filter layer. When the organic layer 1150 is a color filter layer, the color filter layer may be a color filter layer having any color, such as a red color, a green color, a blue color or a white color.

A pixel electrode PE may be electrically connected to the drain electrode DE. The pixel electrode PE may be electrically connected to the drain electrode DE through the contact hole CNT.

Referring to FIG. 10, a transparent conductive layer is formed on the organic layer 1150 and patterned to form a pixel electrode PE.

The transparent conductive layer may include a transparent conductive material, such as indium tin oxide (ITO) and/or indium zinc oxide (IZO). The pixel electrode PE may be electrically connected to the drain electrode DE through the contact hole CNT.

Since the buffer layer BL is formed using a relatively low electric power, deterioration of the active pattern and the source metal pattern may be minimized. In addition, when the buffer BL layer includes silicon oxide (SiOx) and is formed using a low electric power, $H_2SiOx$ may be generated. Thus, the quantity of hydrogen in the buffer layer BL may be increased. Accordingly, oxygen may be provided to the active pattern AP during its formation, so that carriers may be increased in the active pattern AP.

Figure 17:
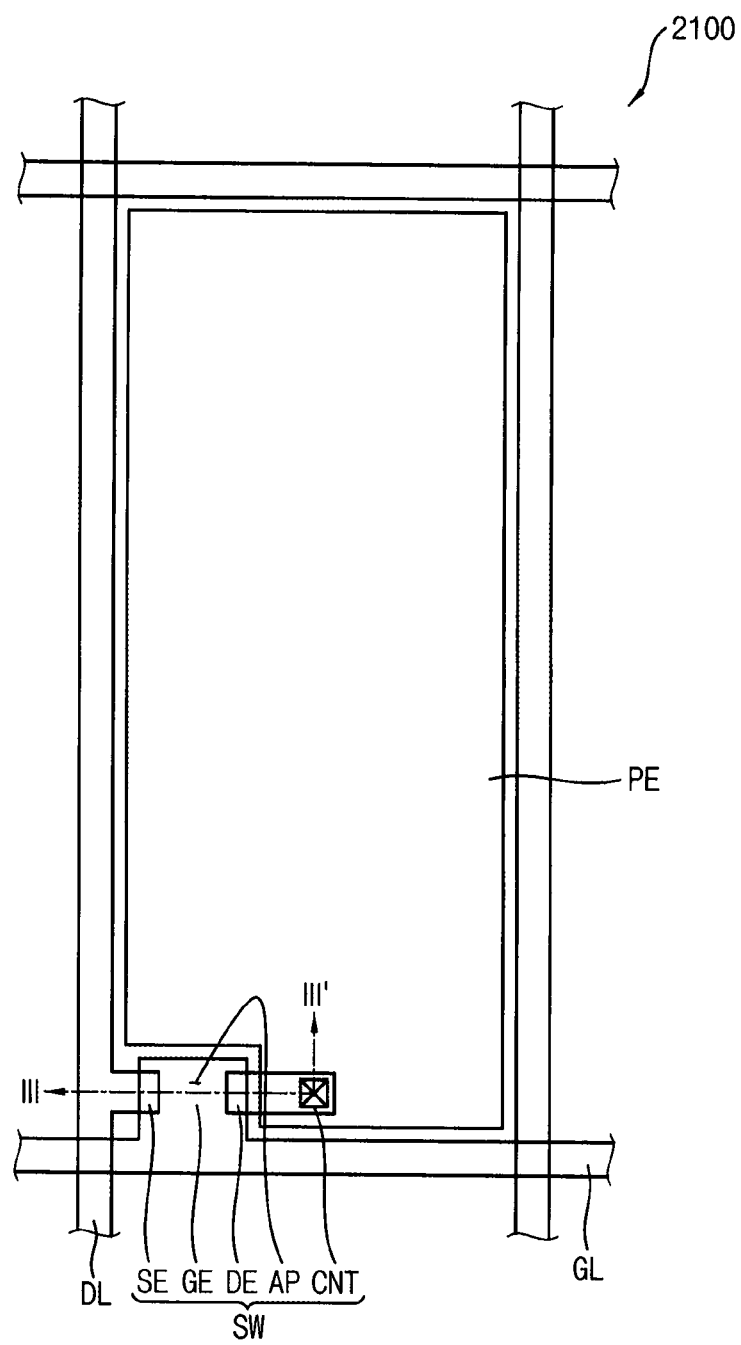
FIG. 17 is a plan view illustrating a thin film transistor substrate according to an exemplary embodiment of the inventive concept.
Figure 18:
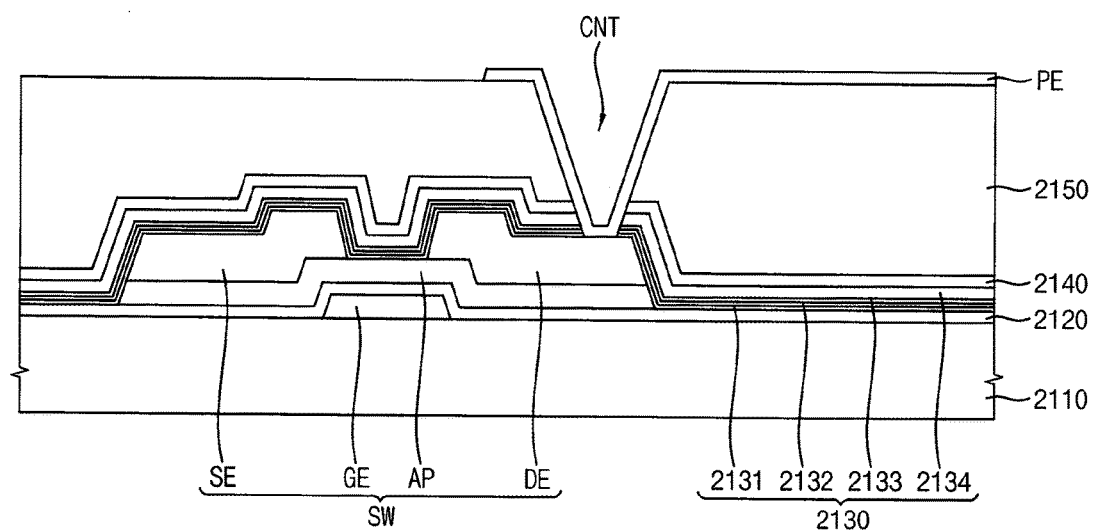
FIG. 18 is a cross-sectional view taken along line III-III' of FIG. 17.

FIG. 17 is a plan view illustrating a thin film transistor substrate according to an exemplary embodiment of the inventive concept. FIG. 18 is a cross-sectional view taken along line III-III' of FIG. 17.

Referring to FIGS. 17 and 18, a thin film transistor substrate according to an exemplary embodiment of the present inventive concept includes a gate line GL, a data line DL crossing the gate line GL, a thin film transistor SW which is a switching element, and a pixel electrode PE. The thin film transistor SW may be electrically connected to the gate line GL and the data line DL. The pixel electrode PE may be electrically connected to the thin film transistor SW through a contact hole CNT.

The gate line GL extends in a first direction D1. The gate line GL may have a single layer structure including copper (Cu), silver (Ag), chrome (Cr), molybdenum (Mo), aluminum (Al), titanium (Ti), manganese (Mn) or any mixture thereof. In addition, the gate line GL may have a multilayer structure having a plurality of layers of different materials. For example, the gate line GL may include a copper layer and a titanium layer disposed on and/or under the copper layer. The gate line GL is electrically connected to a gate electrode GE of the thin film transistor SW. In addition, portions of the gate line GL may form the gate electrode GE.

A gate insulation layer 2120 is formed on the gate line GL and the gate electrode GE. The gate insulation layer 2120 may include an inorganic material such as silicon oxide (SiOx) and/or silicon nitride (SiNx). For example, the gate insulation layer 2120 can include silicon oxide (SiOx), and may have a thickness of about 500 Å. In addition, the gate insulation layer 2120 may include a plurality of layers of different materials.

An active pattern AP is formed on the gate insulation layer 2120. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. Any one or more of these materials is contemplated. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

A first passivation layer 2130 is formed on the source metal pattern. The first passivation layer 2130 may include an inorganic material such as silicon oxide (SiOx) and/or silicon nitride (SiNx). For example, the first passivation layer 2130 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The first passivation layer 2130 may be formed by using a plasma treatment process. The first passivation layer 2130 may include a first sub passivation layer 2131, a second sub passivation layer 2132, a third sub passivation layer 2133 and a fourth sub passivation layer 2134.

The first sub passivation layer 2131, the second sub passivation layer 2132 and the third sub passivation layer 2133 may be formed by a plasma treatment process using an electric power less than 1.5 kW. When a silicon oxide (SiOx) first passivation layer 2130 is formed using a low electric power, H$_2$SiOx may be generated. Thus, the quantity of hydrogen in first passivation layer 2130 layer may be increased. Since the first sub passivation layer 2131, the second sub passivation layer 2132 and the third sub passivation layer 2133 are formed using a relatively low electric power, deterioration of the active pattern and the source metal pattern may be minimized. In addition, oxygen may be provided to the active pattern AP, so that carriers may be increased in the active pattern AP.

The first sub passivation layer 2131 contacts the active pattern AP. For example, the first sub passivation layer 2131 may be formed using an electric power of more than 0.3 kW and less than 0.5 kW. Preferably, the first sub passivation layer 2131 may be formed using an electric power of 0.4 kW. The second sub passivation layer 2132 is disposed on the first sub passivation layer 2131. For example, the second sub passivation layer 2132 may be formed using an electric power of more than 0.6 kW and less than 0.8 kW. Preferably, the second sub passivation layer 2132 may be formed using an electric power of 0.7 kW. The third sub passivation layer 2133 is disposed on the second sub passivation layer 2132. For example, the third sub passivation layer 2133 may be formed using an electric power of more than 0.9 kW and less than 1.2 kW. Preferably, the third sub passivation layer 2133 may be formed using an electric power of 1.0 kW. For example, the fourth sub passivation layer 2134 may be formed using an electric power of more than 3.5 kW and less than 4.5 kW. Preferably, the fourth sub passivation layer 2134 may be formed using an electric power of 4.0 kW.

The quantity of hydrogen contained in the first sub passivation layer 2131 is greater than the quantity of hydrogen contained in the second sub passivation layer 2132. The quantity of hydrogen contained in the second sub passivation layer 2132 is greater than the quantity of hydrogen contained in the third sub passivation layer 2133. The quantity of hydrogen contained in the third sub passivation layer 2133 is greater than the quantity of hydrogen contained in the fourth sub passivation layer 2134.

The first sub passivation layer 2131, the second sub passivation layer 2132, the third sub passivation layer 2133 and the fourth sub passivation layer 2134 may each include the same material.

A second passivation layer 2140 is formed on the first passivation layer 2130. The second passivation layer 2140 may include an inorganic material such as silicon oxide (SiOx) and/or silicon nitride (SiNx). For example, the second passivation layer 2140 includes silicon oxide (SiOx), and may have a thickness of about 500 Å. In addition, the second passivation layer 2140 may include a plurality of layers of different materials.

The second passivation layer 2140 may be formed using a plasma treatment process. For example, the second passivation layer 2140 may be formed by plasma treatment using an electric power of more than 7.5 kW and less than 8.5 kW. Preferably, the second passivation layer 2140 may be formed using an electric power of 7.7 kW. The quantity or density of hydrogen contained in the first passivation layer 2130 is less than the quantity or density of hydrogen contained in the second passivation layer 2140.

An organic layer 2150 is formed on the second passivation layer 2140. The organic layer 2150 planarizes an upper surface of the thin film transistor substrate 2100 so that problems due to step height differences in the upper surfaces of underlying layers, such as disconnection of a signal line, may be prevented. The organic layer 2150 may be an insulation layer including an organic material. For example, the organic layer 2150 may a color filter layer. When the organic layer 2150 is a color filter layer, the color filter layer may be a color filter layer having any color, such as a red color, a green color, a blue color or a white color.

A pixel electrode PE is formed on the organic layer 2150. The pixel electrode PE may include a transparent conductive material, such as indium tin oxide (ITO) and/or indium zinc oxide (IZO). In addition, the pixel electrode PE may include titanium (Ti) and/or molybdenum titanium (MoTi). The pixel electrode PE may be electrically connected to the drain electrode DE. The pixel electrode PE may be electrically connected to the drain electrode DE through the contact hole CNT.

FIGS. 19 to 22 are cross-sectional views illustrating a method of manufacturing the thin film transistor substrate of FIG. 18. FIGS. 23A and 23B are graphs illustrating plasma treatment electric power usage in a method of manufacturing the thin film transistor substrate of FIG. 18.

Figure 19:
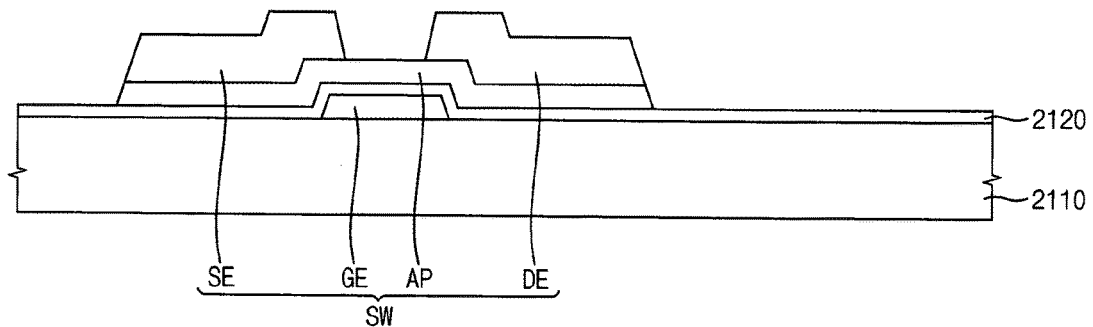
FIGS. 19 to 22 are cross-sectional views illustrating a method of manufacturing the thin film transistor substrate of FIG. 18.

Referring to FIG. 19, a gate electrode GE, a gate insulation layer 2120, an active pattern AP, a source electrode SE and a drain electrode DE are formed on a base substrate 2110.

A gate metal pattern including the gate electrode GE is formed on the base substrate 2110. The gate metal pattern may further include a gate line electrically connected with the gate electrode GE.

A gate metal layer is patterned to form the gate line and the gate electrode GE, after the gate metal layer is formed on the base substrate 2110. Examples of the base substrate 2110 may include a glass substrate, a quartz substrate, a silicon substrate, a plastic substrate or the like.

The gate metal layer may have a single layer structure including copper (Cu), silver (Ag), chrome (Cr), molybdenum (Mo), aluminum (Al), titanium (Ti), manganese (Mn) or any mixture thereof. In addition, the gate metal layer may have a multilayer structure having a plurality of layers including materials different each other. For example, the gate metal layer may include a copper layer and a titanium layer disposed on and/or under the copper layer.

A gate insulation layer 2120 is formed on the gate line GL and the gate electrode GE. The gate insulation layer 2120 may include an inorganic material such as silicon oxide (SiOx) and/or silicon nitride (SiNx). For example, the gate insulation layer 2120 can include silicon oxide (SiOx). In addition, the gate insulation layer 2120 may include a plurality of layers of different materials.

An active pattern AP is formed on the gate insulation layer 2120. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used individually or in any combination. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

Figure 20:
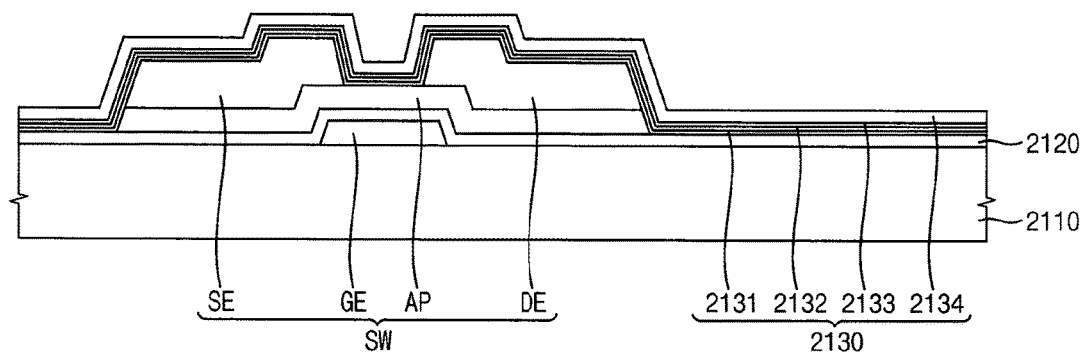

Referring to FIG. 20, a first passivation layer 2130 is formed on the source electrode SE and the drain electrode DE. The first passivation layer 2130 may include a first sub passivation layer 2131, a second sub passivation layer 2132, a third sub passivation layer 2133 and a fourth sub passivation layer 2134.

The first sub passivation layer 2131, the second sub passivation layer 2132 and the third sub passivation layer 2133 may be formed by a plasma treatment process as above, using an electric power less than 1.5 kW. When the first passivation layer 2130 includes a silicon oxide (SiOx) and is formed by using a low electric power, H$_2$SiOx may be generated. Thus, the quantity of hydrogen in first passivation layer 2130 layer may be increased. Since the first sub passivation layer 2131, the second sub passivation layer 2132 and the third sub passivation layer 2133 are formed using a relatively low electric power, deterioration of the active pattern AP and the source metal pattern may be minimized. In addition, oxygen may be provided to the active pattern AP, so that carriers may be increased in the active pattern AP.

The first sub passivation layer 2131 contacts the active pattern AP. As one example, the first sub passivation layer 2131 may be formed using an electric power of more than 0.3 kW and less than 0.5 kW. Preferably, the first sub passivation layer 2131 may be formed using an electric power of 0.4 kW. The second sub passivation layer 2132 is disposed on the first sub passivation layer 2131. As an example, the second sub passivation layer 2132 may be formed using an electric power of more than 0.6 kW and less than 0.8 kW. Preferably, the second sub passivation layer 2132 may be formed using an electric power of 0.7 kW. The third sub passivation layer 2133 is disposed on the second sub passivation layer 2132. As an example, the third sub passivation layer 2133 may be formed using an electric power of more than 0.9 kW and less than 1.2 kW. Preferably, the third sub passivation layer 2133 may be formed using an electric power of 1.0 kW. As one example, the fourth sub passivation layer 2134 may be formed using an electric power of more than 3.5 kW and less than 4.5 kW. Preferably, the fourth sub passivation layer 2134 may be formed using an electric power of 4.0 kW.

The quantity of hydrogen contained in the first sub passivation layer 2131 is greater than the quantity of hydrogen contained in the second sub passivation layer 2132. The quantity of hydrogen contained in the second sub passivation layer 2132 is greater than the quantity of hydrogen contained in the third sub passivation layer 2133. The quantity of hydrogen contained in the third sub passivation layer 2133 is greater than the quantity of hydrogen contained in the fourth sub passivation layer 2134.

The first sub passivation layer 2131, the second sub passivation layer 2132, the third sub passivation layer 2133 and the fourth sub passivation layer 2134 may include the same material.

Figure 21:
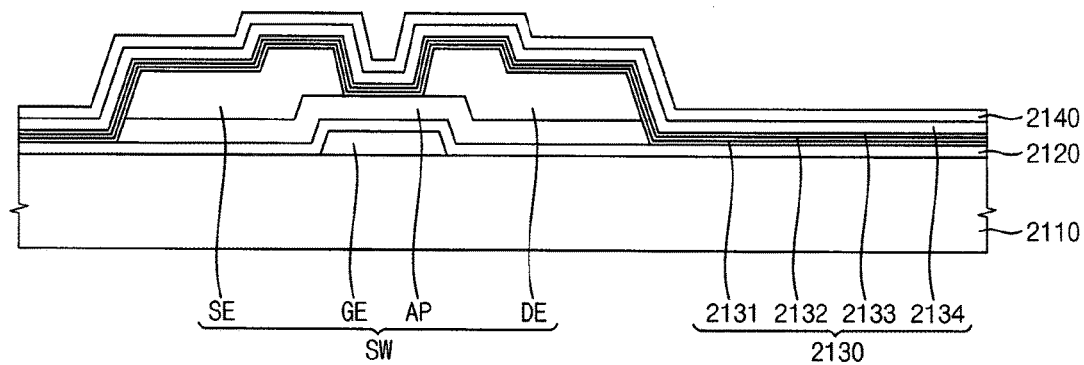

Referring to FIG. 21, a second passivation layer 2140 is formed on the first passivation layer 2130.

The second passivation layer 2140 may be formed using a plasma treatment process. For example, the second passivation layer 2140 may be formed using an electric power of more than 7.5 kW and less than 8.5 kW. Preferably, the second passivation layer 2140 may be formed using an electric power of 7.7 kW. The quantity of hydrogen contained in the first passivation layer 2130 is less than the quantity of hydrogen contained in the second passivation layer 2140.

The second passivation layer 2140 may include an inorganic material such as silicon oxide (SiOx) and/or silicon nitride (SiNx). For example, the second passivation layer 2140 may include silicon oxide (SiOx), and may have a thickness of about 500 Å. In addition, the second passivation layer 2140 may include a plurality of layers of different materials.

Referring to FIGS. 23A and 23B, electric power levels used in forming the first passivation layer 2130 and the second passivation layer 2140 are illustrated.

The first passivation layer 2130 may be formed using an electric power of D kW, E kW, A kW and B kW. The first passivation layer 2130 may include a first sub passivation layer 2131, a second sub passivation layer 2132, a third sub passivation layer 2133 and a fourth sub passivation layer 2134, as above.

The first sub passivation layer 2131 may be formed using an electric power of D kW. The second sub passivation layer 2132 may be formed using an electric power of E kW which is higher than power level D. The third sub passivation layer 2133 may be formed using an electric power of A kW which is higher than power level E. For example, power level A may be 1.0 kW. The fourth sub passivation layer 2134 may be formed using an electric power of B kW which is higher than power level A. As an example, power level B kW may be 4.0 kW. That is, the first passivation layer 2130 may be formed using an electric power of D kW, E kW, A kW and B kW during a first time t1.

The second passivation layer 2140 may be formed using an electric power of C kW which is higher than B. That is, the second passivation layer 2140 may be formed using an electric power of C kW during a second time t2. As an example, the third time t3 may be more than 5 seconds and less than 20 seconds. The power level C may be 7.7 kW. The first time t1 may be about twice the second time t2.

Figure 22:
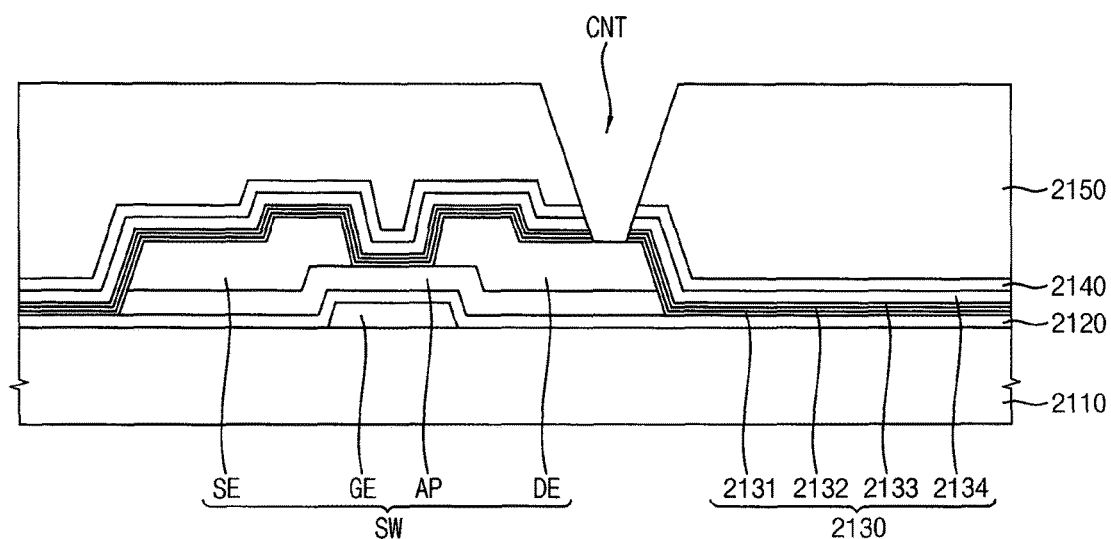
Figure 23A:
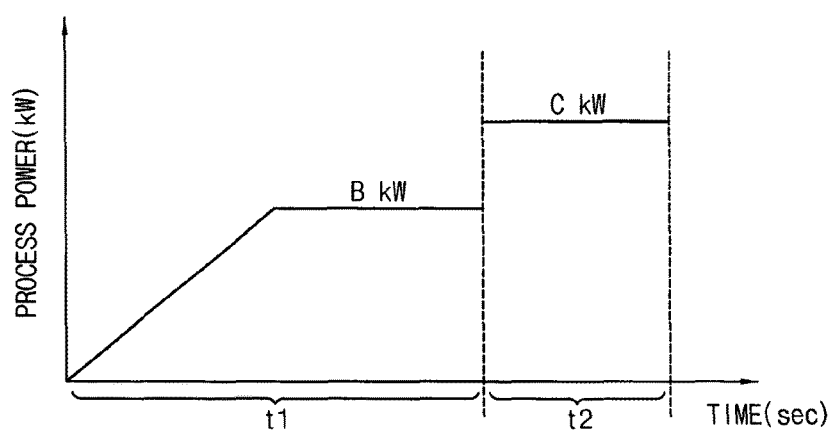
FIGS. 23A and 23B are graphs illustrating electric power use in a method of manufacturing the thin film transistor substrate of FIG. 18.
Figure 23B:
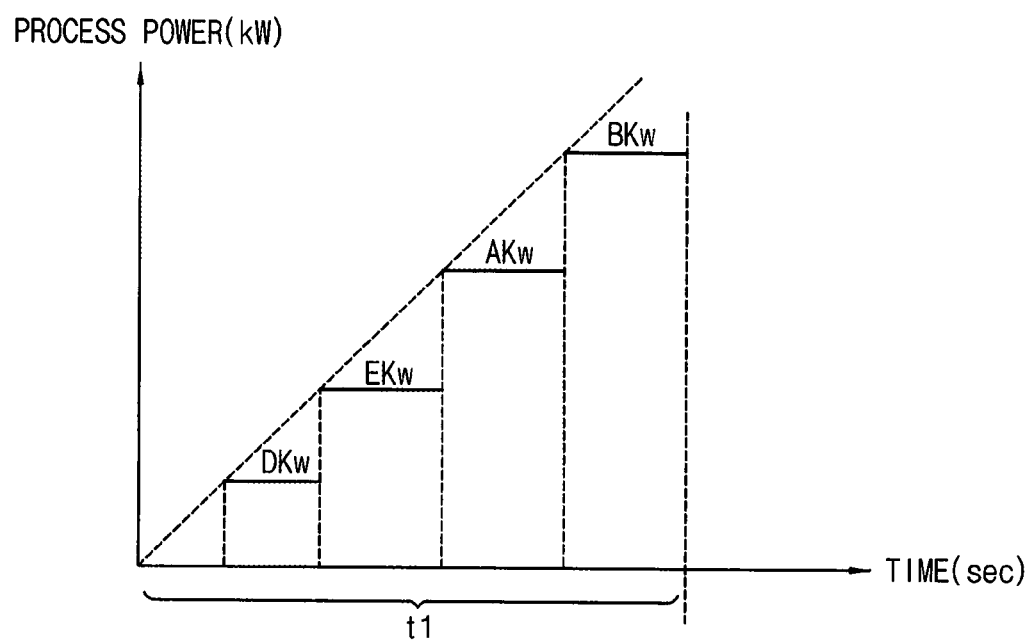

Referring to FIG. 22, an organic layer 2150 is formed over the second passivation layer 2140. Thereafter, a contact hole CNT is formed through the first passivation layer 2130, the second passivation layer 2140 and the organic layer 2150.

The organic layer 2150 planarizes an upper surface of the display substrate 2100 so that problems due to step differences in elevations of an underlying surface, such as disconnection of a signal line, may be prevented. The organic layer 2150 may be an insulation layer including an organic material. For example, the organic layer 2150 may a color filter layer. When the organic layer 2150 is a color filter layer, the color filter layer may be a color filter layer having any color, such as a red color, a green color, a blue color or a white color.

A pixel electrode PE may be electrically connected to the drain electrode DE. The pixel electrode PE may be electrically connected to the drain electrode DE through the contact hole CNT.

Referring to FIG. 18, a transparent conductive layer is formed on the organic layer 2150 and patterned to form a pixel electrode PE.

The transparent conductive layer may include a transparent conductive material, such as indium tin oxide (ITO) and/or indium zinc oxide (IZO). The pixel electrode PE may be electrically connected to the drain electrode DE through the contact hole CNT.

Since the first sub passivation layer 2131, the second sub passivation layer 2132 and the third sub passivation layer 2133 are formed by using a relatively low electric power, deterioration of the active pattern and the source metal pattern may be minimized. In addition, when the first sub passivation layer 2131, the second sub passivation layer 2132 and the third sub passivation layer 2133 include silicon oxide (SiOx) and are formed using a low electric power, $H_2SiOx$ may be generated. Thus, the quantity of hydrogen in first sub passivation layer 2131, the second sub passivation layer 2132 and the third sub passivation layer 2133 may be increased. Accordingly, oxygen may be provided to the active pattern AP, so that carriers may be increased in the active pattern AP.

Figure 24:
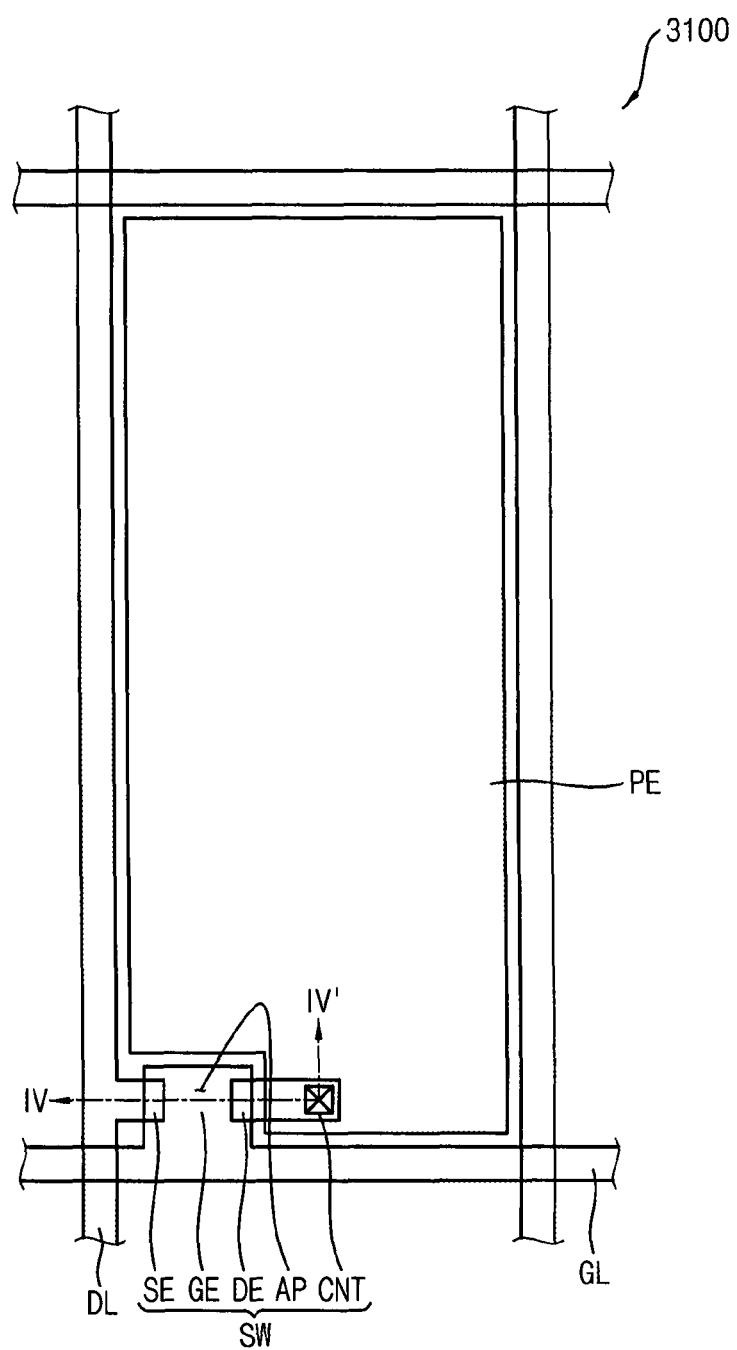
FIG. 24 is a plan view illustrating a thin film transistor substrate according to an exemplary embodiment of the inventive concept.
Figure 25:
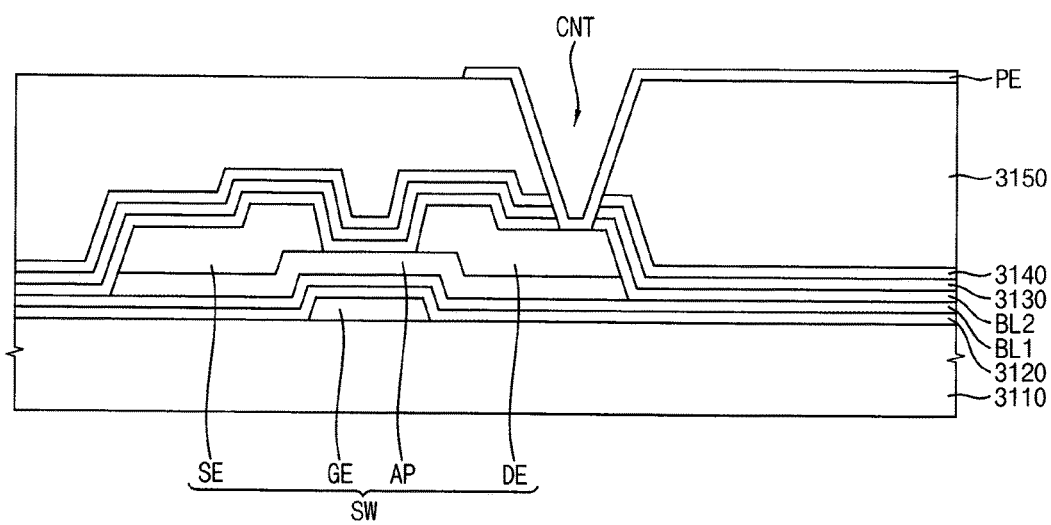
FIG. 25 is a cross-sectional view taken along line IV-IV' of FIG. 24.

FIG. 24 is a plan view illustrating a thin film transistor substrate according to an exemplary embodiment of the inventive concept. FIG. 25 is a cross-sectional view taken along line IV-IV' of FIG. 24.

Referring to FIGS. 24 and 25, a thin film transistor substrate according to an exemplary embodiment of the present inventive concept includes a gate line GL, a data line DL crossing the gate line GL, a thin film transistor SW which is a switching element, and a pixel electrode PE. The thin film transistor SW may be electrically connected to the gate line GL and the data line DL. The pixel electrode PE may be electrically connected to the thin film transistor SW through a contact hole CNT.

The thin film transistor substrate 3100 according to the present exemplary embodiment is substantially the same as the thin film transistor substrate of FIGS. 1 and 2 except for a lower buffer layer BL1, and thus like reference numerals are used for like elements and repetitive explanation will be omitted.

The lower buffer layer BL1 is formed on the gate insulation layer 3120. The lower buffer layer BL1 may include an inorganic material such as silicon oxide (SiOx) and/or silicon nitride (SiNx). For example, the lower buffer layer BL1 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The lower buffer layer BL1 may be formed using a plasma treatment process. As one example, the lower buffer layer BL1 may be formed using an electric power of more than 0.5 kW and less than 1.5 kW. Preferably, the lower buffer layer BL1 may be formed using an electric power of 1.0 kW. When the lower buffer layer includes silicon oxide (SiOx) and is formed by using a low electric power, $H_2SiOx$ may be generated. Thus, the quantity of hydrogen in the lower buffer layer BL1 may be increased. Since the lower buffer layer BL1 is formed using a relatively low electric power, deterioration of the active pattern AP and the source metal pattern may be minimized. In addition, oxygen may be provided to the active pattern AP, so that carriers may be increased in the active pattern AP. The quantity of hydrogen contained in the lower buffer layer BL1 is greater than the quantity of hydrogen contained in the first passivation layer 3130.

An active pattern AP is formed on the lower buffer layer BL1. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. Any of these materials, or any combination thereof, may be used. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

A buffer layer BL2 is formed on the source metal pattern. The buffer layer BL2 may include an inorganic material such as silicon oxide (SiOx) and/or silicon nitride (SiNx). For example, the buffer layer BL2 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The buffer layer BL2 may be formed by using a plasma treatment process. In this process, the buffer layer BL2 may be formed using an electric power of more than 0.5 kW and less than 1.5 kW. Preferably, the buffer layer BL2 may be formed using an electric power of 1.0 kW. When the buffer layer includes silicon oxide (SiOx) and is formed by using a low electric power, $H_2SiOx$ may be generated. Thus, the quantity of hydrogen in the buffer layer BL2 may be increased. Since the buffer layer BL2 is formed by using a relatively low electric power, deterioration of the active pattern AP and the source metal pattern may be minimized. In addition, oxygen may be provided to the active pattern AP, so that carrier numbers may be increased in the active pattern AP.

A first passivation layer 3130 is formed on the buffer layer BL2. The first passivation layer 3130 may include an inorganic material such as silicon oxide (SiOx) and/or silicon nitride (SiNx). For example, the first passivation layer 3130 can include silicon oxide (SiOx), and may have a thickness of about 500 Å. In addition, the first passivation layer 3130 may include a plurality of layers of different materials.

The first passivation layer 3130 may be formed using a plasma treatment process. In this process, the first passivation layer 3130 may be formed using an electric power of more than 3.5 kW and less than 4.5 kW. Preferably, the first passivation layer 3130 may be formed using an electric power of 4.0 kW. The quantity of hydrogen contained in the buffer layer BL2 is greater than the quantity of hydrogen contained in the first passivation layer 3130.

A second passivation layer 3140 is formed on the first passivation layer 3130. The second passivation layer 3140 may include an inorganic material such as silicon oxide (SiOx) and/or silicon nitride (SiNx). For example, the second passivation layer 3140 can include silicon oxide (SiOx), and may have a thickness of about 500 Å. In addition, the second passivation layer 3140 may include a plurality of layers of different materials.

The second passivation layer 3140 may be formed using a plasma treatment process. In this process, the second passivation layer 3140 may be formed using an electric power of more than 7.5 kW and less than 8.5 kW. Preferably, the second passivation layer 3140 may be formed using an electric power of 7.7 kW. The quantity of hydrogen contained in the buffer layer BL2 is less than the quantity of hydrogen contained in the second passivation layer 3140.

FIGS. 26 to 31 are cross-sectional views illustrating a method of manufacturing the thin film transistor substrate of FIG. 25.

Figure 26:
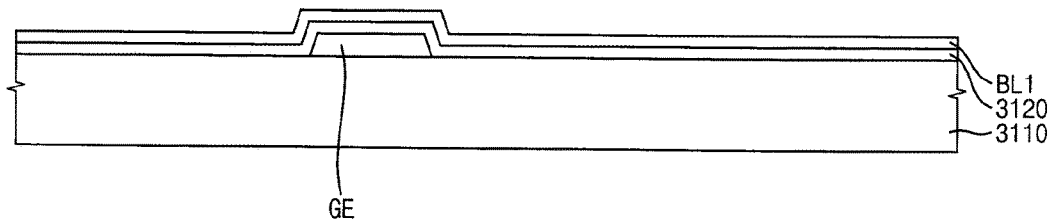
FIGS. 26 to 31 are cross-sectional views illustrating a method of manufacturing the thin film transistor substrate of FIG. 25.

Referring to FIG. 26, a gate electrode GE, a gate insulation layer 3120 and a lower buffer layer BL1 are formed on a base substrate 3110.

A gate metal pattern including the gate electrode GE is formed on the base substrate 3110. The gate metal pattern may further include a gate line electrically connected to the gate electrode GE.

A gate metal layer is patterned to form the gate line and the gate electrode GE, after the gate metal layer is formed on the base substrate 3110. Examples of the base substrate 3110 may include a glass substrate, a quartz substrate, a silicon substrate, a plastic substrate or the like.

The gate metal layer may have a single layer structure including copper (Cu), silver (Ag), chrome (Cr), molybdenum (Mo), aluminum (Al), titanium (Ti), manganese (Mn) or any mixture thereof. In addition, the gate metal layer may have a multilayer structure having a plurality of layers of different materials. For example, the gate metal layer may include a copper layer and a titanium layer disposed on and/or under the copper layer.

A gate insulation layer 3120 is formed on the gate line GL and the gate electrode GE. The gate insulation layer 3120 may include an inorganic material such as silicon oxide (SiOx) and/or silicon nitride (SiNx). For example, the gate insulation layer 3120 may include silicon oxide (SiOx). In addition, the gate insulation layer 3120 may include a plurality of layers of different materials.

The lower buffer layer BL1 is formed on the gate insulation layer 3120. The lower buffer layer BL1 may include an inorganic material such as silicon oxide (SiOx) and/or silicon nitride (SiNx). For example, the lower buffer layer BL1 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The lower buffer layer BL1 may be formed by using a plasma treatment process. In this process, the lower buffer layer BL1 may be formed using an electric power of more than 0.5 kW and less than 1.5 kW. Preferably, the lower buffer layer BL1 may be formed using an electric power of 1.0 kW. When the lower buffer layer includes a silicon oxide (SiOx) and is formed by using a low electric power, $H_2SiOx$ may be generated. Thus, the quantity of hydrogen in the lower buffer layer BL1 may be increased. Since the lower buffer layer BL1 is formed using a relatively low electric power, deterioration of the active pattern AP and the source metal pattern may be minimized. In addition, oxygen may be provided to the active pattern AP, so that carrier numbers may be increased in the active pattern AP.

Figure 27:
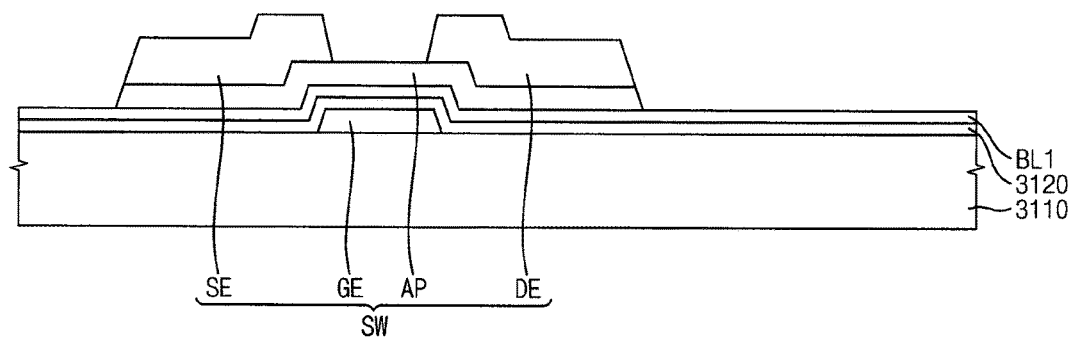

Referring to FIG. 27, an active pattern AP, a source electrode SE and a drain electrode DE are formed on the lower buffer layer BL1.

An active pattern AP is formed on the lower buffer layer BL1. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like, singly or in any combination. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

Figure 28:
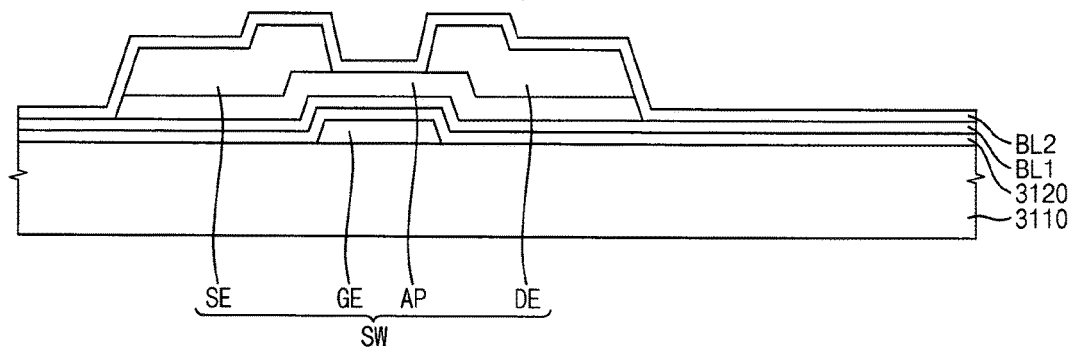

Referring to FIG. 28, a buffer layer BL2 is formed on the source electrode SE and the drain electrode DE.

The buffer layer BL2 may be formed by using a plasma treatment process. In this process, the buffer layer BL2 may be formed using an electric power of more than 0.5 kW and less than 1.5 kW. Preferably, the buffer layer BL2 may be formed using an electric power of 1.0 kW. When the buffer layer includes silicon oxide (SiOx) and is formed using a low electric power, $H_2SiOx$ may be generated. Thus, the quantity of hydrogen in the buffer layer BL2 may be increased. Since the buffer layer BL2 is formed using a relatively low electric power, deterioration of the active pattern AP and the source metal pattern may be minimized. In addition, oxygen may be provided to the active pattern AP, so that carrier amounts may be increased in the active pattern AP.

The buffer layer BL2 may include an inorganic material such as silicon oxide (SiOx) and/or silicon nitride (SiNx). For example, the buffer layer BL2 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

Figure 29:
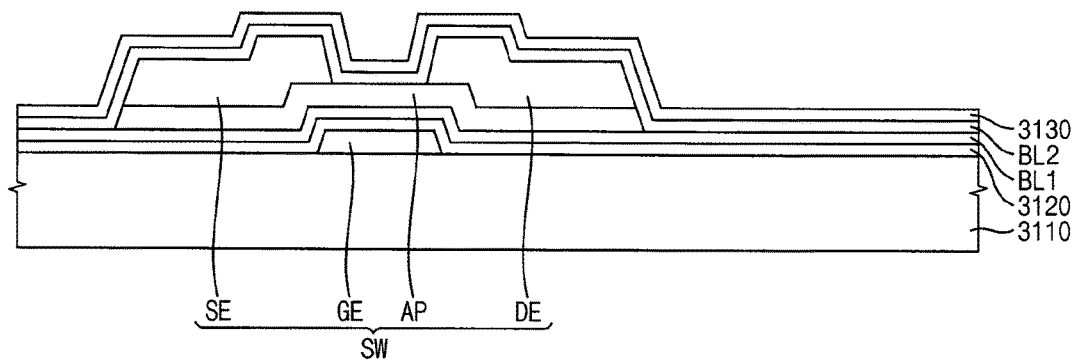

Referring to FIG. 29, a first passivation layer 3130 is formed on the buffer layer BL2.

The first passivation layer 3130 may be formed using a plasma treatment process. During this process, the first passivation layer 3130 may be formed using an electric power of more than 3.5 kW and less than 4.5 kW. Preferably, the first passivation layer 3130 may be formed using an electric power of 4.0 kW. The quantity of hydrogen contained in the buffer layer BL2 is greater than the quantity of hydrogen contained in the first passivation layer 3130.

The first passivation layer 3130 may include an inorganic material such as silicon oxide (SiOx) and/or silicon nitride (SiNx). For example, the first passivation layer 3130 may include silicon oxide (SiOx), and may have a thickness of about 500 Å. In addition, the first passivation layer 3130 may include a plurality of layers of different materials.

Figure 30:
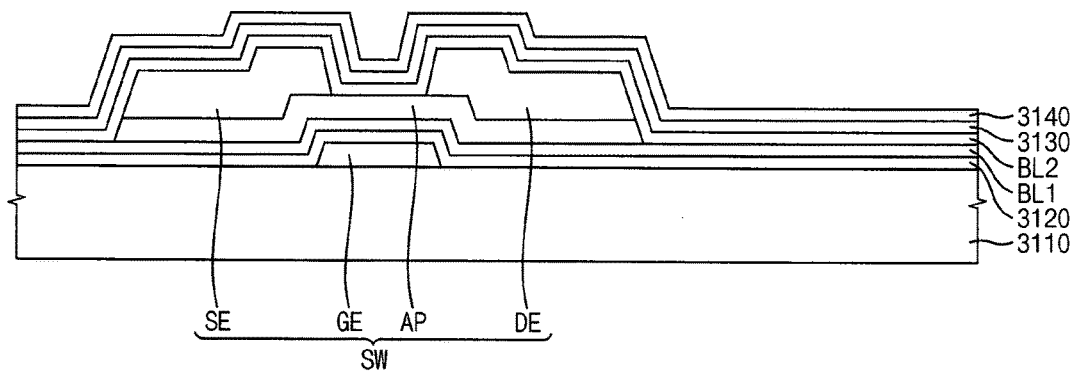

Referring to FIG. 30, a second passivation layer 3140 is formed on the first passivation layer 3130.

The second passivation layer 3140 may be formed using a plasma treatment process. For example, the second passivation layer 3140 may be formed by using an electric power of more than 7.5 kW and less than 8.5 kW. Preferably, the second passivation layer 3140 may be formed by using an electric power of 7.7 kW. The quantity of hydrogen contained in the buffer layer BL2 is less than quantity of hydrogen contained in the second passivation layer 3140.

The second passivation layer 3140 may include an inorganic material such as silicon oxide (SiOx) and/or silicon nitride (SiNx). For example, the second passivation layer 3140 may include silicon oxide (SiOx), and may have a thickness of about 500 Å. In addition, the second passivation layer 3140 may include a plurality of layers having different materials from each other.

Figure 31:
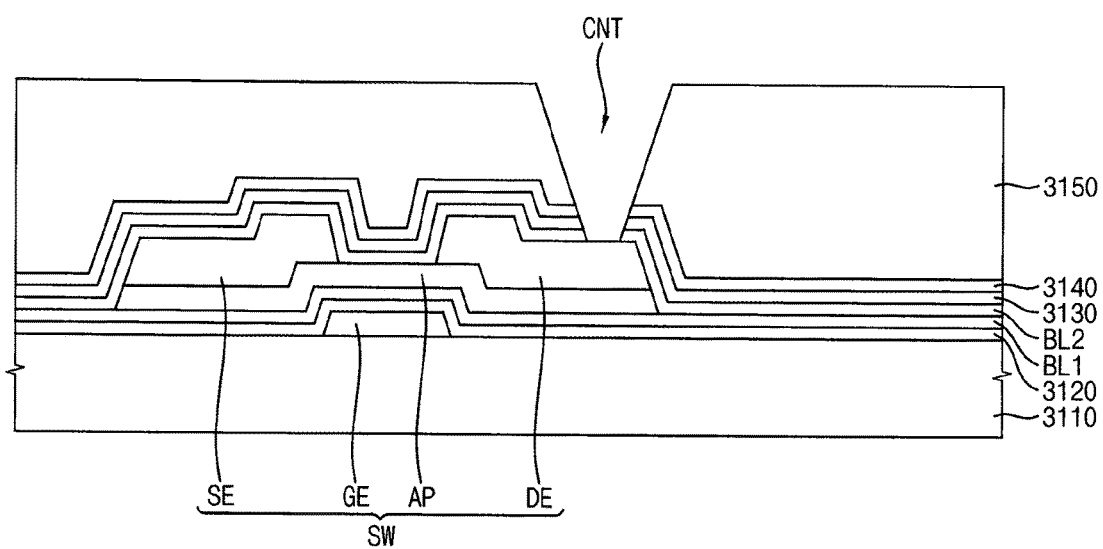

Referring to FIG. 31, an organic layer 3150 is formed on the base substrate 3110 on which the second passivation layer 3140 is formed. Thereafter, a contact hole CNT is formed through the buffer layer BL, the first passivation layer 3130, the second passivation layer 3140 and the organic layer 3150.

The organic layer 3150 planarizes an upper surface of the display substrate 3100 so that problems due to step discontinuities in underlying layers, such as disconnection of a signal line, may be prevented. The organic layer 3150 may be an insulation layer including an organic material. For example, the organic layer 3150 may a color filter layer. When the organic layer 3150 is a color filter layer, the color filter layer may be a color filter layer having any color, such as a red color, a green color, a blue color or a white color.

A pixel electrode PE may be electrically connected to the drain electrode DE. The pixel electrode PE may be electrically connected to the drain electrode DE through the contact hole CNT.

Referring to FIG. 25, a transparent conductive layer is formed on the organic layer 3150 and patterned to form a pixel electrode PE.

The transparent conductive layer may include a transparent conductive material, such as indium tin oxide (ITO) and indium zinc oxide (IZO). The pixel electrode PE may be electrically connected to the drain electrode DE through the contact hole CNT.

Since the buffer layer BL2 is formed using a relatively low electric power as above, deterioration of the active pattern and the source metal pattern may be minimized. In addition, when the buffer layer BL2 includes silicon oxide (SiOx) and is formed using a low electric power, $H_2SiOx$ may be generated. Thus, the quantity of hydrogen in the buffer layer BL2 may be increased. Accordingly, oxygen may be provided to the active pattern AP, so that carriers may be increased in the active pattern AP.

Figure 32:
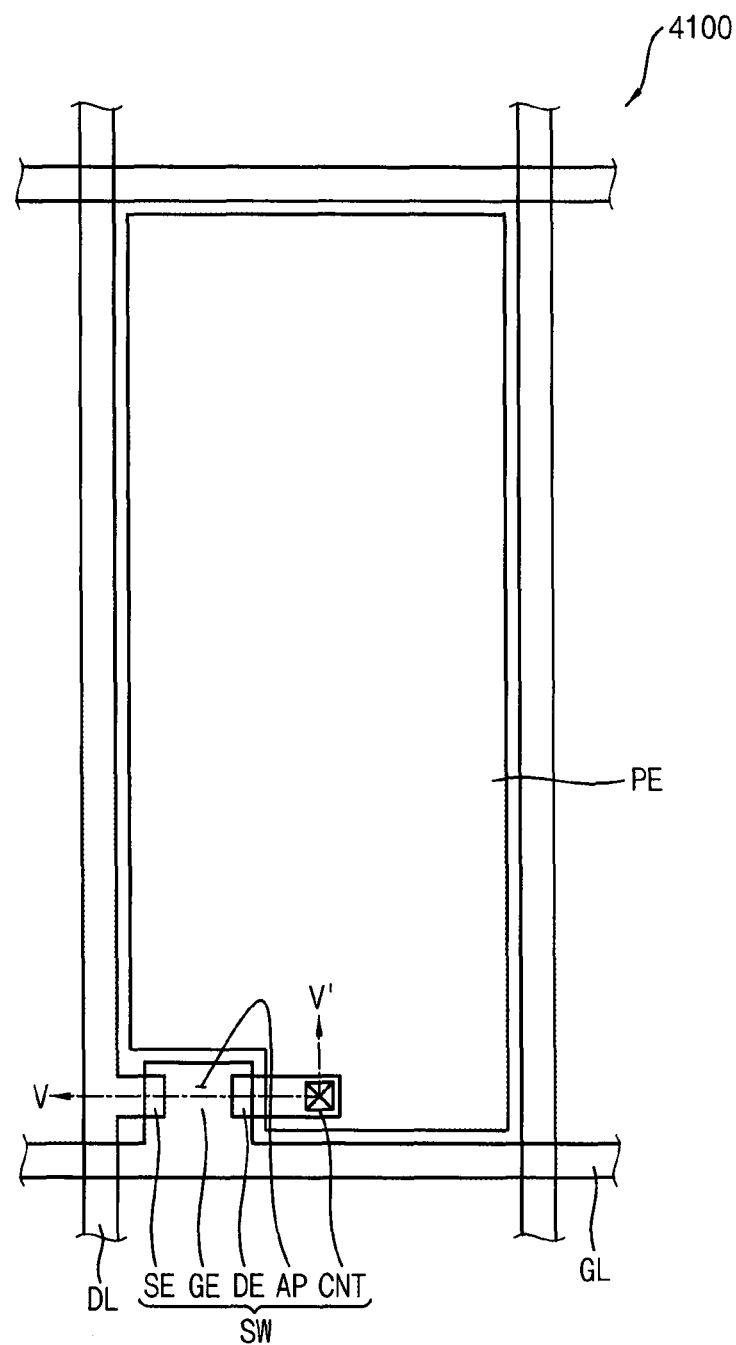
FIG. 32 is a plan view illustrating a thin film transistor substrate according to an exemplary embodiment of the inventive concept.
Figure 33:
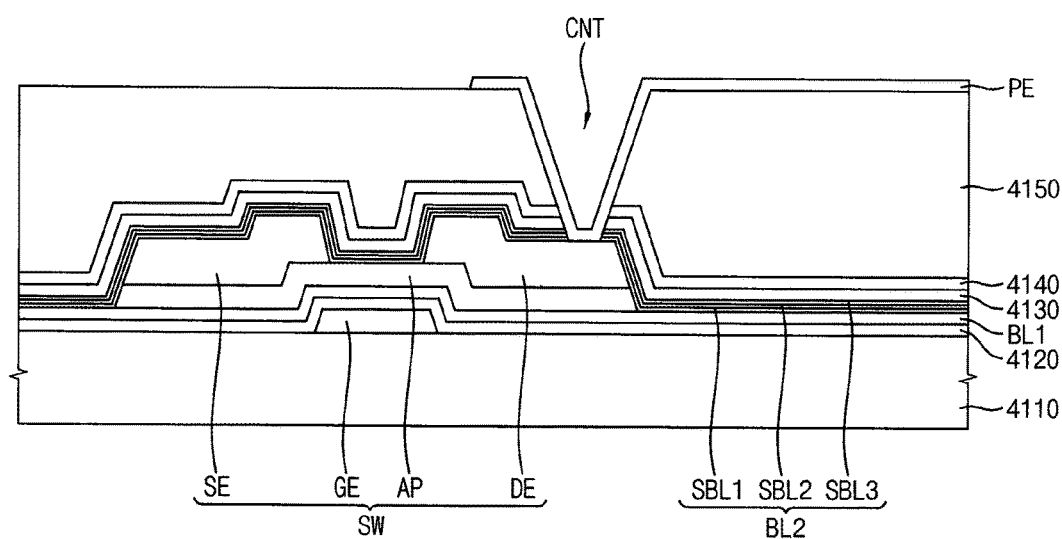
FIG. 33 is a cross-sectional view taken along line V-V' of FIG. 32.

FIG. 32 is a plan view illustrating a thin film transistor substrate according to an exemplary embodiment of the inventive concept. FIG. 33 is a cross-sectional view taken along line V-V' of FIG. 32.

Referring to FIGS. 32 and 33, a thin film transistor substrate according to an exemplary embodiment of the present inventive concept includes a gate line GL, a data line DL crossing the gate line GL, a thin film transistor SW which is a switching element, and a pixel electrode PE. The thin film transistor SW may be electrically connected to the gate line GL and the data line DL. The pixel electrode PE may be electrically connected to the thin film transistor SW through a contact hole CNT.

The thin film transistor substrate 4100 according to the present exemplary embodiment is substantially the same as the thin film transistor substrate of FIGS. 9 and 10 except for a lower buffer layer BL1, and thus like reference numerals are used for like elements and repetitive explanation will be omitted.

The lower buffer layer BL1 is formed on the gate insulation layer 4120. The lower buffer layer BL1 may include an inorganic material such as silicon oxide (SiOx) and/or silicon nitride (SiNx). For example, the lower buffer layer BL1 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The lower buffer layer BL1 may be formed by a plasma treatment process. For example, the lower buffer layer BL1 may be formed by plasma treatment at an electric power of more than 0.5 kW and less than 1.5 kW. Preferably, the lower buffer layer BL1 may be formed using an electric power of 1.0 kW. When the lower buffer layer BL1 includes silicon oxide (SiOx) and is formed by using a low electric power, $H_2SiOx$ may be generated. Thus, the quantity of hydrogen in the lower buffer layer BL1 may be increased. Since the lower buffer layer BL1 is formed using a relatively low electric power, deterioration of the active pattern AP and the source metal pattern may be minimized. In addition, oxygen may be provided to the active pattern AP, so that carriers may be increased in the active pattern AP.

An active pattern AP is formed on the lower buffer layer BL1. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used each alone or in a combination thereof. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

A buffer layer BL2 is formed on the source metal pattern. The buffer layer BL2 may include an inorganic material such as silicon oxide (SiOx) and/or silicon nitride (SiNx). For example, the buffer layer BL2 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The buffer layer BL2 may be formed by using a plasma treatment process. For example, the buffer layer BL2 may be formed by plasma treatment using an electric power of more than 0.5 kW and less than 1.5 kW. Preferably, the buffer layer BL2 may be formed using an electric power of 1.0 kW. When the buffer layer BL2 includes silicon oxide (SiOx) and is formed using a low electric power, $H_2SiOx$ may be generated. Thus, the quantity of hydrogen in the buffer layer BL2 may be increased. Since the buffer layer BL2 is formed using a relatively low electric power, deterioration of the active pattern AP and the source metal pattern may be minimized. In addition, oxygen may be provided to the active pattern AP, so that carriers may be increased in the active pattern AP.

The buffer layer BL2 may include a first sub buffer layer SBL1, a second sub buffer layer SBL2 and a third sub buffer layer SBL3. The first sub buffer layer SBL1 contacts the active pattern AP. As an example, the first sub buffer layer SBL1 may be formed by plasma treatment using an electric power of more than 0.3 kW and less than 0.5 kW. Preferably, the first sub buffer layer SBL1 may be formed using an electric power of 0.4 kW. The second sub buffer layer SBL2 is disposed on the first sub buffer layer SBL1. The second sub buffer layer SBL2 may be formed by plasma treatment using an electric power of more than 0.6 kW and less than 0.8 kW. Preferably, the second sub buffer layer SBL2 may be formed using an electric power of 0.7 kW. The third sub buffer layer SBL3 contacts a first passivation layer 1130. The third sub buffer layer SBL3 may be formed by plasma treatment as well, using an electric power of more than 0.9 kW and less than 1.2 kW. Preferably, the third sub buffer layer SBL3 may be formed using an electric power of 1.0 kW.

The quantity of hydrogen contained in the first sub buffer layer SBL1 is greater than the quantity of hydrogen contained in the second sub buffer layer SBL2. The quantity of hydrogen contained in the second sub buffer layer SBL2 is greater than the quantity of hydrogen contained in the third sub buffer layer SBL3. The first sub buffer layer SBL1, the second sub buffer layer SBL2 and the third sub buffer layer SBL3 may each include the same material.

A first passivation layer 4130 is formed on the third sub buffer layer SBL3. The first passivation layer 4130 may include an inorganic material such as silicon oxide (SiOx) and/or silicon nitride (SiNx). For example, the first passivation layer 4130 can include silicon oxide (SiOx), and may have a thickness of about 500 Å. In addition, the first passivation layer 4130 may include a plurality of layers having different materials from each other.

The first passivation layer 4130 may be formed using a plasma treatment process. For example, the first passivation layer 4130 may be formed by plasma treatment using an electric power of more than 3.5 kW and less than 4.5 kW. Preferably, the first passivation layer 4130 may be formed using an electric power of 4.0 kW. The quantity of hydrogen contained in the buffer layer BL2 is greater than the quantity of hydrogen contained in the first passivation layer 4130.

A second passivation layer 4140 is formed on the first passivation layer 4130. The second passivation layer 4140 may include an inorganic material such as silicon oxide (SiOx) and/or silicon nitride (SiNx). For example, the second passivation layer 4140 can include silicon oxide (SiOx), and may have a thickness of about 500 Å. In addition, the second passivation layer 4140 may include a plurality of layers having different materials from each other.

The second passivation layer 4140 may be formed using a plasma treatment process. For example, the second passivation layer 4140 may be formed by plasma treatment using an electric power of more than 7.5 kW and less than 8.5 kW. Preferably, the second passivation layer 4140 may be formed using an electric power of 7.7 kW. The quantity of hydrogen contained in the buffer layer BL2 is less than the quantity of hydrogen contained in the second passivation layer 4140.

FIGS. 34 to 39 are cross-sectional views illustrating a method of manufacturing the thin film transistor substrate of FIG. 33.

Figure 34:
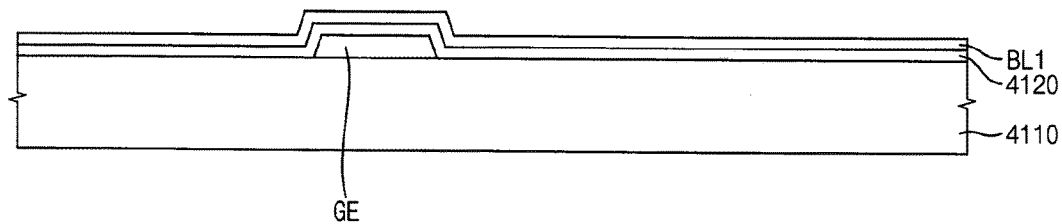
FIGS. 34 to 39 are cross-sectional views illustrating a method of manufacturing the thin film transistor substrate of FIG. 33.

Referring to FIG. 34, a gate electrode GE, a gate insulation layer 4120 and a lower buffer layer BL1 are formed on a base substrate 4110.

A gate metal pattern is formed on the base substrate 4110 and patterned to form the gate line and the gate electrode GE. The gate line is electrically connected to the gate electrode GE.

Examples of the base substrate 4110 may include a glass substrate, a quartz substrate, a silicon substrate, a plastic substrate or the like.

The gate metal layer may have a single layer structure including copper (Cu), silver (Ag), chrome (Cr), molybdenum (Mo), aluminum (Al), titanium (Ti), manganese (Mn) or any mixture thereof. In addition, the gate metal layer may have a multilayer structure having a plurality of layers of materials that are different from each other. For example, the gate metal layer may include a copper layer and a titanium layer disposed on and/or under the copper layer.

A gate insulation layer 4120 is formed on the gate line GL and the gate electrode GE. The gate insulation layer 4120 may include an inorganic material such as silicon oxide (SiOx) and/or silicon nitride (SiNx). For example, the gate insulation layer 4120 includes silicon oxide (SiOx). In addition, the gate insulation layer 4120 may include a plurality of layers having different materials from each other.

The lower buffer layer BL1 is formed on the gate insulation layer 4120. The lower buffer layer BL1 may include an inorganic material such as silicon oxide (SiOx) and/or silicon nitride (SiNx). For example, the lower buffer layer BL1 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The lower buffer layer BL1 may be formed by using a plasma treatment process. For example, the lower buffer layer BL1 may be formed by plasma treatment using an electric power of more than 0.5 kW and less than 1.5 kW. Preferably, the lower buffer layer BL1 may be formed using an electric power of 1.0 kW. When the lower buffer layer BL1 includes silicon oxide (SiOx) and is formed by using a low electric power, $H_2SiOx$ may be generated. Thus, the quantity of hydrogen in the lower buffer layer BL1 may be increased. Since the lower buffer layer BL1 is formed using a relatively low electric power, deterioration of the active pattern AP and the source metal pattern may be minimized. In addition, oxygen may be provided to the active pattern AP, so that carriers may be increased in the active pattern AP.

Figure 35:
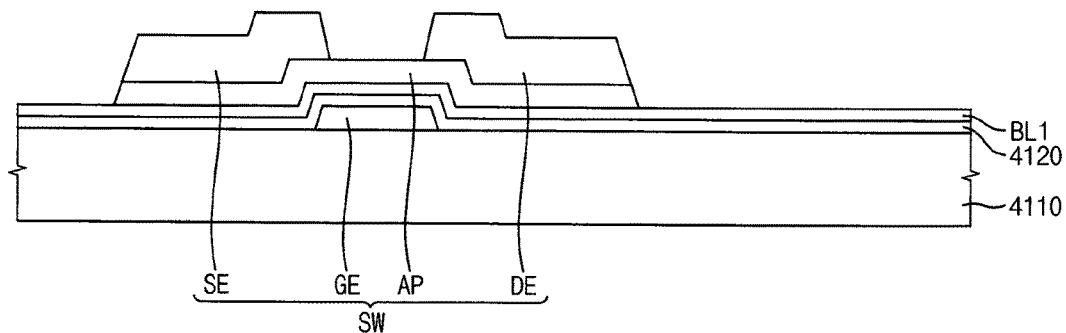

Referring to FIG. 35, an active pattern AP, a source electrode SE and a drain electrode DE are formed on the lower buffer layer BL1.

An active pattern AP is formed on the lower buffer layer BL1. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used each alone or in any combination. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

Figure 36:
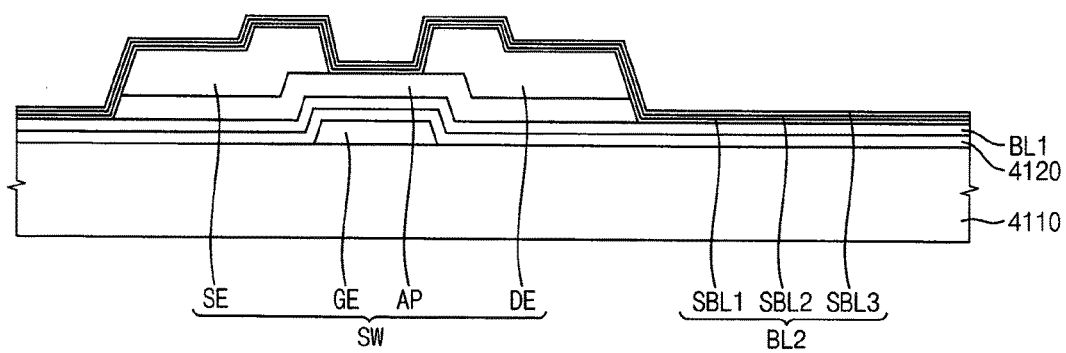

Referring to FIG. 36, a buffer layer BL2 is formed on the source electrode SE and the drain electrode DE. The buffer layer BL2 may include a first sub buffer layer SBL1, a second sub buffer layer SBL2 and a third sub buffer layer SBL3.

The buffer layer BL2 may be formed by using a plasma treatment process. For example, the buffer layer BL2 may be formed by plasma treatment using an electric power of less than 1.5 kW. When the buffer layer BL2 includes silicon oxide (SiOx) and is formed using a low electric power, $H_2SiOx$ may be generated. Thus, the quantity of hydrogen in the buffer layer BL2 may be increased. Since the buffer layer BL2 is formed using a relatively low electric power, deterioration of the active pattern AP and the source metal pattern may be minimized. In addition, oxygen may be provided to the active pattern AP, so that carriers may be increased in the active pattern AP.

The buffer layer BL2 may include a first sub buffer layer SBL1, a second sub buffer layer SBL2 and a third sub buffer layer SBL3. The first sub buffer layer SBL1 contacts the active pattern AP. The first sub buffer layer SBL1 may be formed by plasma treatment using an electric power of more than 0.3 kW and less than 0.5 kW. Preferably, the first sub buffer layer SBL1 may be formed using an electric power of 0.4 kW. The second sub buffer layer SBL2 is disposed on the first sub buffer layer SBL1. The second sub buffer layer SBL2 may be formed by plasma treatment using an electric power of more than 0.6 kW and less than 0.8 kW. Preferably, the second sub buffer layer SBL2 may be formed using an electric power of 0.7 kW. The third sub buffer layer SBL3 contacts a first passivation layer 1130. The third sub buffer layer SBL3 may be formed by plasma treatment using an electric power of more than 0.9 kW and less than 1.2 kW. Preferably, the third sub buffer layer SBL3 may be formed using an electric power of 1.0 kW.

The quantity of hydrogen contained in the first sub buffer layer SBL1 is greater than the quantity of hydrogen contained in the second sub buffer layer SBL2. The quantity of hydrogen contained in the second sub buffer layer SBL2 is greater than the quantity of hydrogen contained in the third sub buffer layer SBL3. The first sub buffer layer SBL1, the second sub buffer layer SBL2 and the third sub buffer layer SBL3 may include the same material.

The buffer layer BL2 may include an inorganic material such as silicon oxide (SiOx) and/or silicon nitride (SiNx). For example, the buffer layer BL2 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

Figure 37:
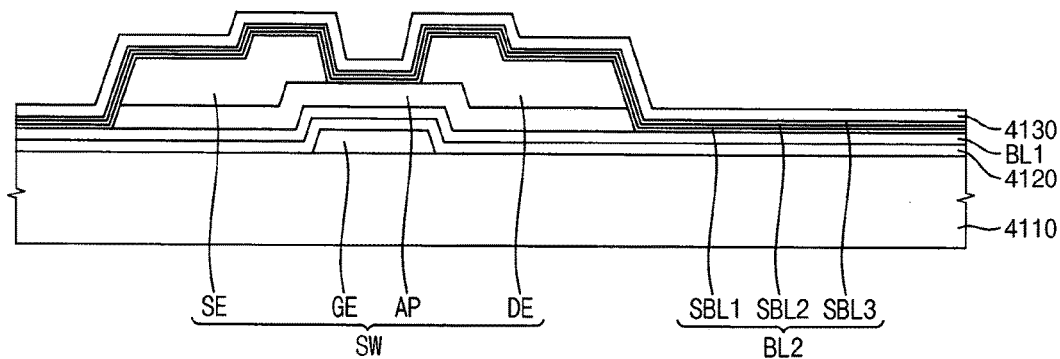

Referring to FIG. 37, a first passivation layer 4130 is formed on the buffer layer BL2.

The first passivation layer 4130 may be formed using a plasma treatment process. In this process, the first passivation layer 4130 may be formed using an electric power of more than 3.5 kW and less than 4.5 kW. Preferably, the first passivation layer 4130 may be formed using an electric power of 4.0 kW. The quantity of hydrogen contained in the buffer layer BL2 is greater than the quantity of hydrogen contained in the first passivation layer 4130.

The first passivation layer 4130 may include an inorganic material such as silicon oxide (SiOx) and/or silicon nitride (SiNx). For example, the first passivation layer 4130 can include silicon oxide (SiOx), and may have a thickness of about 500 Å. In addition, the first passivation layer 4130 may include a plurality of layers having different materials from each other.

Figure 38:
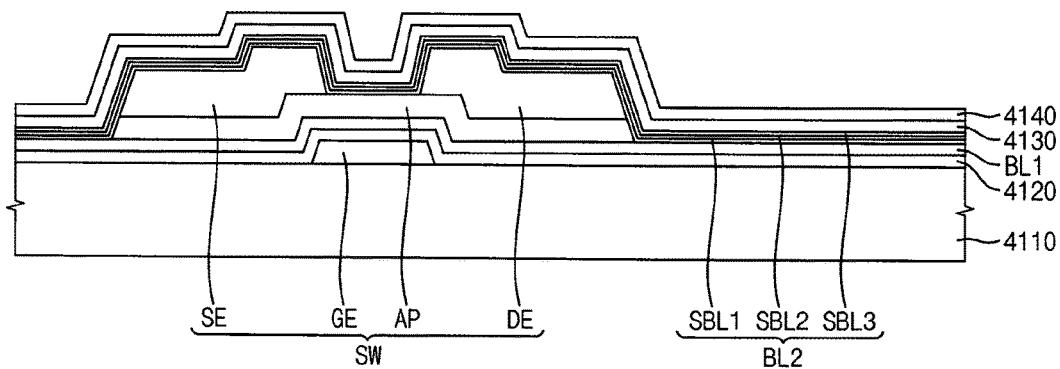

Referring to FIG. 38, a second passivation layer 4140 is formed on the first passivation layer 4130.

The second passivation layer 4140 may be formed using a plasma treatment process. As one example, the second passivation layer 4140 may be formed by plasma treatment using an electric power of more than 7.5 kW and less than 8.5 kW. Preferably, the second passivation layer 4140 may be formed using an electric power of 7.7 kW. The quantity of hydrogen contained in the buffer layer BL2 is less than the quantity of hydrogen contained in the second passivation layer 4140.

The second passivation layer 4140 may include an inorganic material such as silicon oxide (SiOx) and/or silicon nitride (SiNx). For example, the second passivation layer 4140 can include silicon oxide (SiOx), and may have a thickness of about 500 Å. In addition, the second passivation layer 4140 may include a plurality of layers having different materials from each other.

Figure 39:
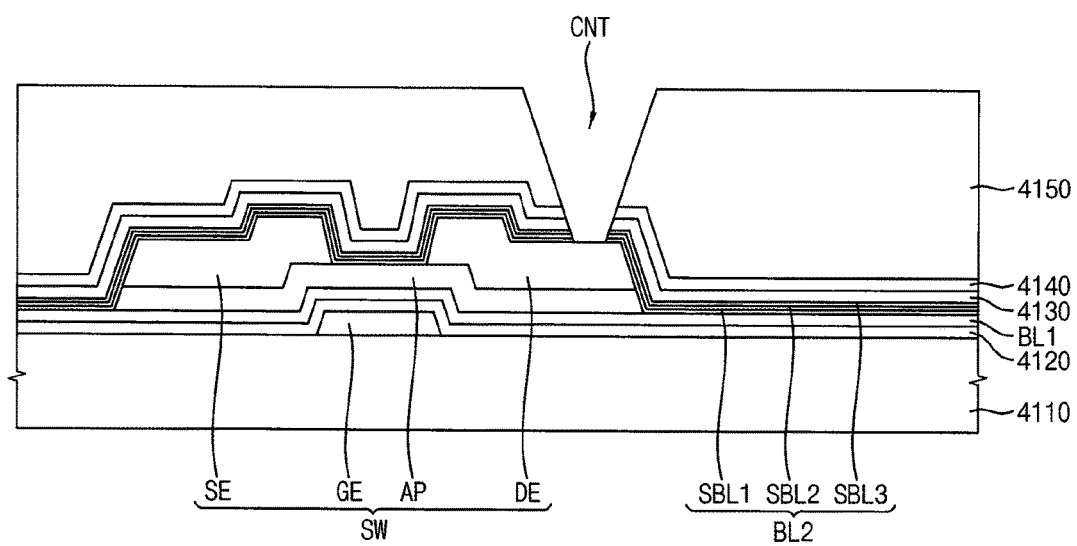

Referring to FIG. 39, an organic layer 4150 is formed on the second passivation layer 4140. Thereafter, a contact hole CNT is formed through the buffer layer BL, the first passivation layer 4130, the second passivation layer 4140 and the organic layer 4150.

The organic layer 4150 planarizes an upper surface of the display substrate 4100 so that problems due to step discontinuities in underlying layers, such as disconnection of a signal line, may be prevented. The organic layer 4150 may be an insulation layer including an organic material. For example, the organic layer 4150 may a color filter layer. When the organic layer 4150 is a color filter layer, the color filter layer may be a color filter layer having any color, such as a red color, a green color, a blue color or a white color.

A pixel electrode PE may be electrically connected to the drain electrode DE. The pixel electrode PE may be electrically connected to the drain electrode DE through the contact hole CNT.

Referring to FIG. 33, a transparent conductive layer is formed on the organic layer 4150 and patterned to form a pixel electrode PE.

The transparent conductive layer may include a transparent conductive material, such as indium tin oxide (ITO) and indium zinc oxide (IZO). The pixel electrode PE may be electrically connected to the drain electrode DE through the contact hole CNT.

Since the buffer layer BL is formed using a relatively low electric power, deterioration of the active pattern AP and the source metal pattern may be minimized. In addition, when the buffer layer BL includes silicon oxide (SiOx) and is formed using a low electric power, $H_2SiOx$ may be generated. Thus, the quantity of hydrogen in the buffer layer BL may be increased. Accordingly, oxygen may be provided to the active pattern AP, so that carriers may be increased in the active pattern AP.

Figure 40:
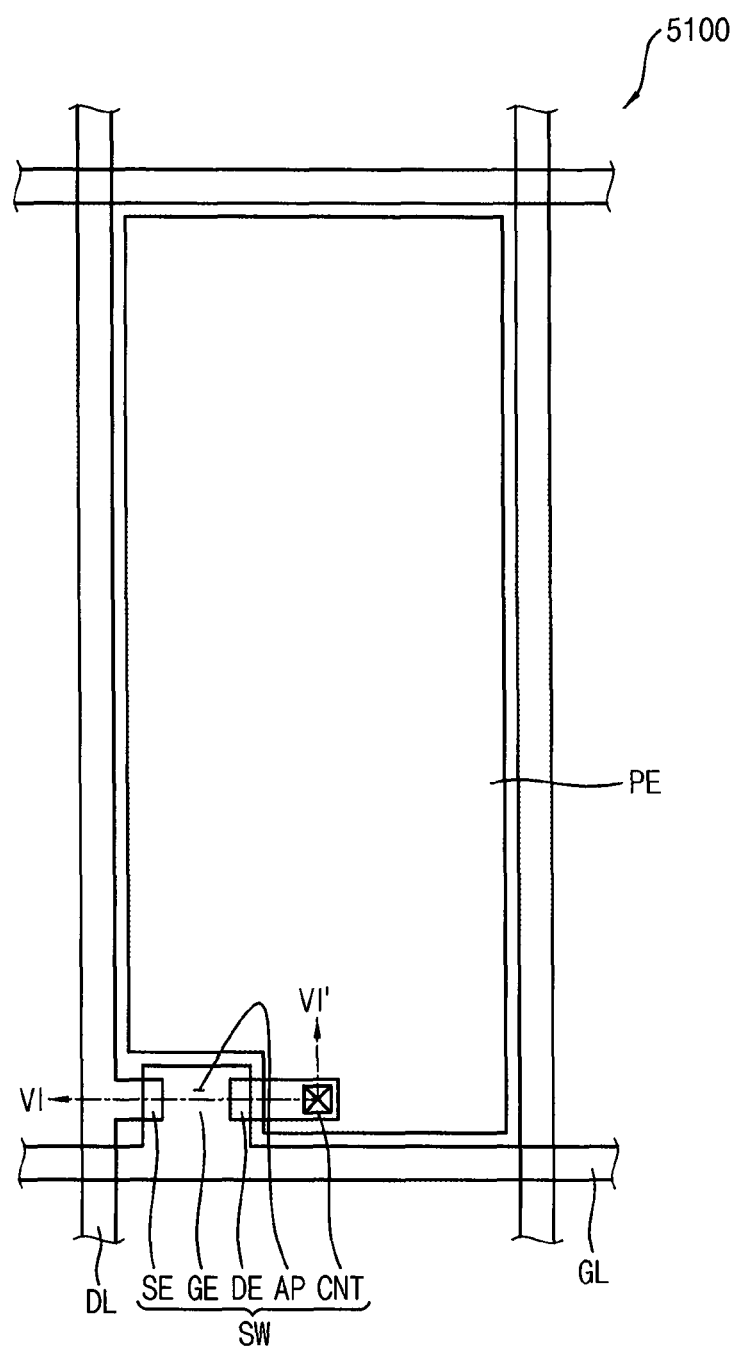
FIG. 40 is a plan view illustrating a thin film transistor substrate according to an exemplary embodiment of the inventive concept.
Figure 41:
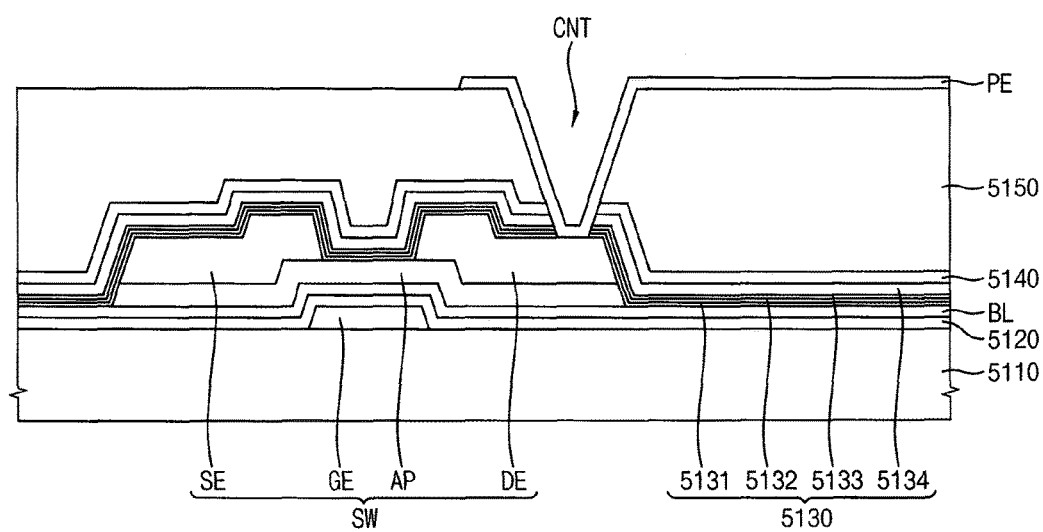
FIG. 41 is a cross-sectional view taken along line VI-VI' of FIG. 40.

FIG. 40 is a plan view illustrating a thin film transistor substrate according to an exemplary embodiment of the inventive concept. FIG. 41 is a cross-sectional view taken along line VI-VI' of FIG. 40.

Referring to FIGS. 40 and 41, a thin film transistor substrate according to an exemplary embodiment of the present inventive concept includes a gate line GL, a data line DL crossing the gate line GL, a thin film transistor SW which is a switching element, and a pixel electrode PE. The thin film transistor SW may be electrically connected to the gate line GL and the data line DL. The pixel electrode PE may be electrically connected to the thin film transistor SW through a contact hole CNT.

The thin film transistor substrate 5100 according to the present exemplary embodiment is substantially the same as the thin film transistor substrate of FIGS. 17 and 18 except for a lower buffer layer BL, and thus like reference numerals are used for like elements and repetitive explanation will be omitted.

The lower buffer layer BL is formed on the gate insulation layer 5120. The lower buffer layer BL may include an inorganic material such as silicon oxide (SiOx) and/or silicon nitride (SiNx). For example, the lower buffer layer BL may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The lower buffer layer BL may be formed using a plasma treatment process. For example, the lower buffer layer BL may be formed by plasma treatment using an electric power of more than 0.5 kW and less than 1.5 kW. Preferably, the lower buffer layer BL may be formed using an electric power of 1.0 kW. When the lower buffer layer BL includes silicon oxide (SiOx) is formed using a low electric power, $H_2SiOx$ may be generated. Thus, the quantity of hydrogen in the lower buffer layer BL may be increased. Since the lower buffer layer BL is formed using a relatively low electric power, deterioration of the active pattern AP and the source metal pattern may be minimized. In addition, oxygen may be provided to the active pattern AP, so that carriers may be increased in the active pattern AP.

An active pattern AP is formed on the lower buffer layer BL. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used alone or in any combination. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

A first passivation layer 5130 is formed on the source metal pattern. The first passivation layer 5130 may include an inorganic material such as silicon oxide (SiOx) and/or silicon nitride (SiNx). For example, the first passivation layer 5130 may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The first passivation layer 5130 may be formed using a plasma treatment process. The first passivation layer 5130 may include a first sub passivation layer 5131, a second sub passivation layer 5132, a third sub passivation layer 5133 and a fourth sub passivation layer 5134.

The first sub passivation layer 5131, the second sub passivation layer 5132 and the third sub passivation layer 5133 may each be formed by plasma treatment using an electric power less than 1.5 kW. When the first passivation layer 5130 includes silicon oxide (SiOx) and is formed using a low electric power, $H_2SiOx$ may be generated. Thus, the quantity of hydrogen in first passivation layer 2130 layer may be increased. Since the first sub passivation layer 2131, the second sub passivation layer 2132 and the third sub passivation layer 2133 are formed using one or more relatively low electric power levels, deterioration of the active pattern AP and the source metal pattern may be minimized. In addition, oxygen may be provided to the active pattern AP, so that carriers may be increased in the active pattern AP.

The first sub passivation layer 5131 contacts the active pattern AP. The first sub passivation layer 5131 may be formed using an electric power of more than 0.3 kW and less than 0.5 kW. Preferably, the first sub passivation layer 5131 may be formed using an electric power of 0.4 kW. The second sub passivation layer 5132 is disposed on the first sub passivation layer 5131. The second sub passivation layer 5132 may be formed using an electric power of more than 0.6 kW and less than 0.8 kW. Preferably, the second sub passivation layer 5132 may be formed using an electric power of 0.7 kW. The third sub passivation layer 5133 is disposed on the second sub passivation layer 5132. The third sub passivation layer 5133 may be formed using an electric power of more than 0.9 kW and less than 1.2 kW. Preferably, the third sub passivation layer 5133 may be formed using an electric power of 1.0 kW. The fourth sub passivation layer 5134 is formed on the third sub passivation layer 5133 and may be formed using an electric power of more than 3.5 kW and less than 4.5 kW. Preferably, the fourth sub passivation layer 5134 may be formed by using an electric power of 4.0 kW.

The quantity of hydrogen contained in the first sub passivation layer 5131 is greater than the quantity of hydrogen contained in the second sub passivation layer 5132. The quantity of hydrogen contained in the second sub passivation layer 5132 is greater than the quantity of hydrogen contained in the third sub passivation layer 5133. The quantity of hydrogen contained in the third sub passivation layer 5133 is greater than the quantity of hydrogen contained in the fourth sub passivation layer 5134.

The first sub passivation layer 5131, the second sub passivation layer 5132, the third sub passivation layer 5133 and the fourth sub passivation layer 5134 may all include the same material.

A second passivation layer 5140 is formed on the first passivation layer 5130. The second passivation layer 5140 may include an inorganic material such as silicon oxide (SiOx) and/or silicon nitride (SiNx). For example, the second passivation layer 5140 may include silicon oxide (SiOx), and may have a thickness of about 500 Å. In addition, the second passivation layer 5140 may include a plurality of layers of different materials.

The second passivation layer 5140 may be formed using a plasma treatment process. For example, the second passivation layer 5140 may be formed by plasma treatment using an electric power of more than 7.5 kW and less than 8.5 kW. Preferably, the second passivation layer 5140 may be formed using an electric power of 7.7 kW. The quantity of hydrogen contained in the first passivation layer 5130 is less than the quantity of hydrogen contained in the second passivation layer 5140.

FIGS. 42 to 46 are cross-sectional views illustrating a method of manufacturing the thin film transistor substrate of FIG. 41.

Figure 42:
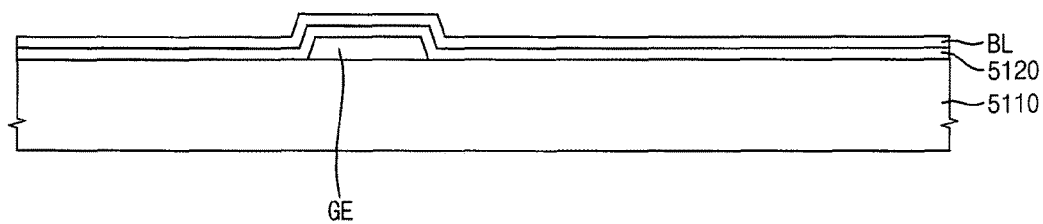
FIGS. 42 to 46 are cross-sectional views illustrating a method of manufacturing the thin film transistor substrate of FIG. 41.

Referring to FIG. 42, a gate electrode GE, a gate insulation layer 5120 and a lower buffer layer BL are formed on a base substrate 5110.

A gate metal layer is formed on the base substrate 5110 and patterned to form the gate line and the gate electrode GE.

Examples of the base substrate 5110 may include a glass substrate, a quartz substrate, a silicon substrate, a plastic substrate or the like.

The gate metal layer may have a single layer structure including copper (Cu), silver (Ag), chrome (Cr), molybdenum (Mo), aluminum (Al), titanium (Ti), manganese (Mn) or any mixture thereof. In addition, the gate metal layer may have a multilayer structure having a plurality of layers of materials different from each other. For example, the gate metal layer may include a copper layer and a titanium layer disposed on and/or under the copper layer.

A gate insulation layer 5120 is formed on the gate line GL and the gate electrode GE. The gate insulation layer 5120 may include an inorganic material such as silicon oxide (SiOx) and/or silicon nitride (SiNx). For example, the gate insulation layer 5120 may include silicon oxide (SiOx). In addition, the gate insulation layer 5120 may include a plurality of layers of different materials.

The lower buffer layer BL is formed on the gate insulation layer 5120. The lower buffer layer BL may include an inorganic material such as silicon oxide (SiOx) and/or silicon nitride (SiNx). For example, the lower buffer layer BL may include a silicon oxide (SiOx), an aluminum oxide (AlOx), a gallium oxide (GaOx), a titanium oxide (TiOx), a tantalum oxide (TaOx), a manganese oxide (MnOx), a silicon oxynitride (SiON), an aluminum oxynitride (AlON) or a gallium oxynitride (GaON).

The lower buffer layer BL may be formed using a plasma treatment process. For example, the lower buffer layer BL may be formed by plasma treatment using an electric power of more than 0.5 kW and less than 1.5 kW. Preferably, the lower buffer layer BL may be formed using an electric power of 1.0 kW. When the lower buffer layer includes silicon oxide (SiOx) and is formed using a low electric power, $H_2SiOx$ may be generated. Thus, the quantity of hydrogen in the lower buffer layer BL may be increased. Since the lower buffer layer BL is formed using a relatively low electric power, deterioration of the active pattern AP and the source metal pattern may be minimized. In addition, oxygen may be provided to the active pattern AP, so that carriers may be increased in the active pattern AP.

Figure 43:
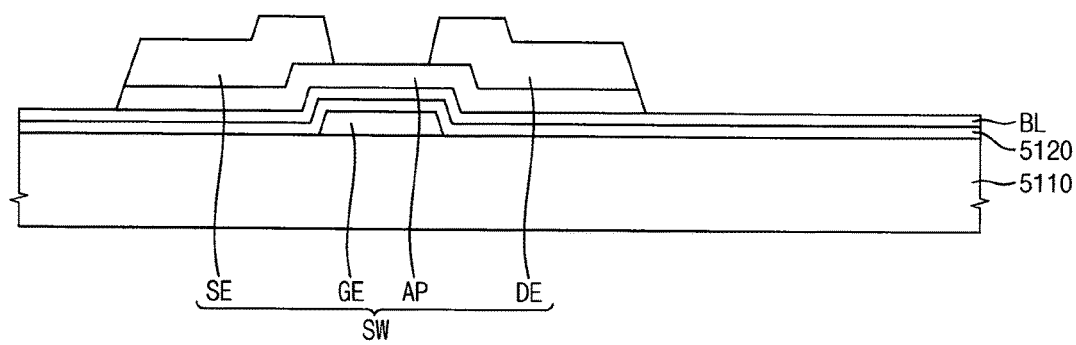

Referring to FIG. 43, an active pattern AP, a source electrode SE and a drain electrode DE are formed on the lower buffer layer BL.

An active pattern AP is formed on the lower buffer layer BL. The active pattern AP includes an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. Any single one of these materials, or any combination, may be used. Preferably, the oxide semiconductor may include IGZO.

A source metal pattern is formed on the active pattern AP. The source metal pattern may include the data line DL, a source electrode SE and a drain electrode DE. The data line DL is electrically connected to the source electrode SE. For example, the source electrode SE may protrude from the data line DL in the first direction D1. The data line DL, the source electrode SE and the drain electrode DE may be disposed in a same layer.

Figure 44:
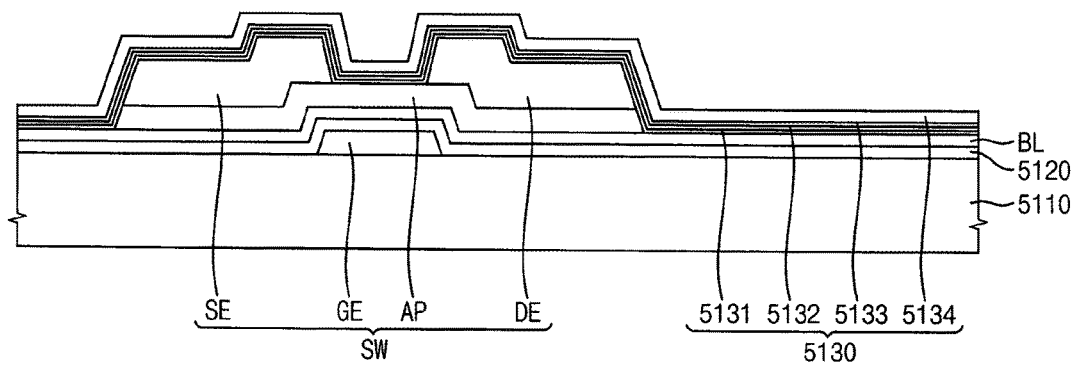

Referring to FIG. 44, a first passivation layer 5130 is formed on the source electrode SE and the drain electrode DE. The first passivation layer 5130 may include a first sub passivation layer 5131, a second sub passivation layer 5132, a third sub passivation layer 5133 and a fourth sub passivation layer 5134.

The first sub passivation layer 5131, the second sub passivation layer 5132 and the third sub passivation layer 5133 may each be formed by plasma treatment using an electric power less than 1.5 kW. When the first passivation layer 5130 includes silicon oxide (SiOx) and is formed using a low electric power, $H_2SiOx$ may be generated. Thus, the quantity of hydrogen in first passivation layer 5130 layer may be increased. Since the first sub passivation layer 5131, the second sub passivation layer 5132 and the third sub passivation layer 5133 are formed using a relatively low electric power, deterioration of the active pattern AP and the source metal pattern may be minimized. In addition, oxygen may be provided to the active pattern AP, so that carriers may be increased in the active pattern AP.

The first sub passivation layer 5131 contacts the active pattern AP. The first sub passivation layer 5131 may be formed using an electric power of more than 0.3 kW and less than 0.5 kW. Preferably, the first sub passivation layer 5131 may be formed using an electric power of 0.4 kW. The second sub passivation layer 5132 is disposed on the first sub passivation layer 5131. Also, the second sub passivation layer 5132 may be formed using an electric power of more than 0.6 kW and less than 0.8 kW. Preferably, the second sub passivation layer 5132 may be formed using an electric power of 0.7 kW. The third sub passivation layer 5133 is disposed on the second sub passivation layer 5132 and may be formed using an electric power of more than 0.9 kW and less than 1.2 kW. Preferably, the third sub passivation layer 5133 may be formed using an electric power of 1.0 kW. The fourth sub passivation layer 5134 may be disposed on the third sub passivation layer 5133 and formed using an electric power of more than 3.5 kW and less than 4.5 kW. Preferably, the fourth sub passivation layer 5134 may be formed using an electric power of 4.0 kW.

The quantity of hydrogen contained in the first sub passivation layer 5131 is greater than the quantity of hydrogen contained in the second sub passivation layer 5132. The quantity of hydrogen contained in the second sub passivation layer 5132 is greater than the quantity of hydrogen contained in the third sub passivation layer 5133. The quantity of hydrogen contained in the third sub passivation layer 5133 is greater than the quantity of hydrogen contained in the fourth sub passivation layer 5134.

The first sub passivation layer 5131, the second sub passivation layer 5132, the third sub passivation layer 5133 and the fourth sub passivation layer 5134 may all include the same material.

Figure 45:
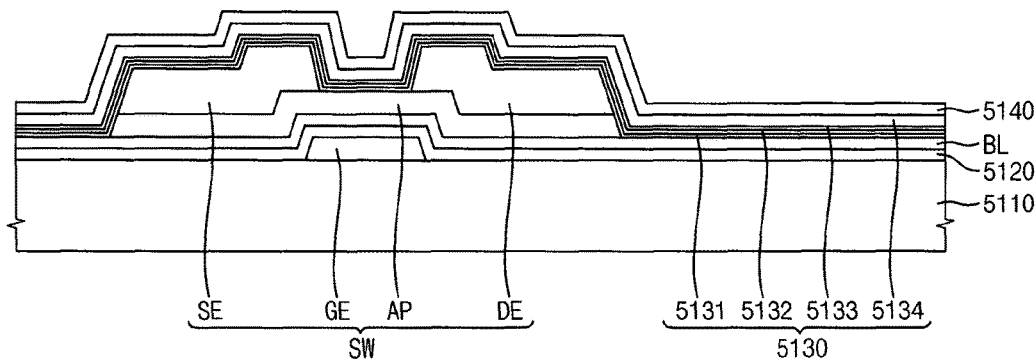

Referring to FIG. 45, a second passivation layer 5140 is formed on the first passivation layer 5130.

The second passivation layer 5140 may be formed using a plasma treatment process. For example, the second passivation layer 5140 may be formed by plasma treatment using an electric power of more than 7.5 kW and less than 8.5 kW. Preferably, the second passivation layer 5140 may be formed using an electric power of 7.7 kW. The quantity of hydrogen contained in the first passivation layer 5130 is less than the quantity of hydrogen contained in the second passivation layer 5140.

The second passivation layer 5140 may include an inorganic material such as silicon oxide (SiOx) and/or silicon nitride (SiNx). For example, the second passivation layer

5140 includes silicon oxide (SiOx), and may have a thickness of about 500 Å. In addition, the second passivation layer 5140 may include a plurality of layers of different materials.

Figure 46:
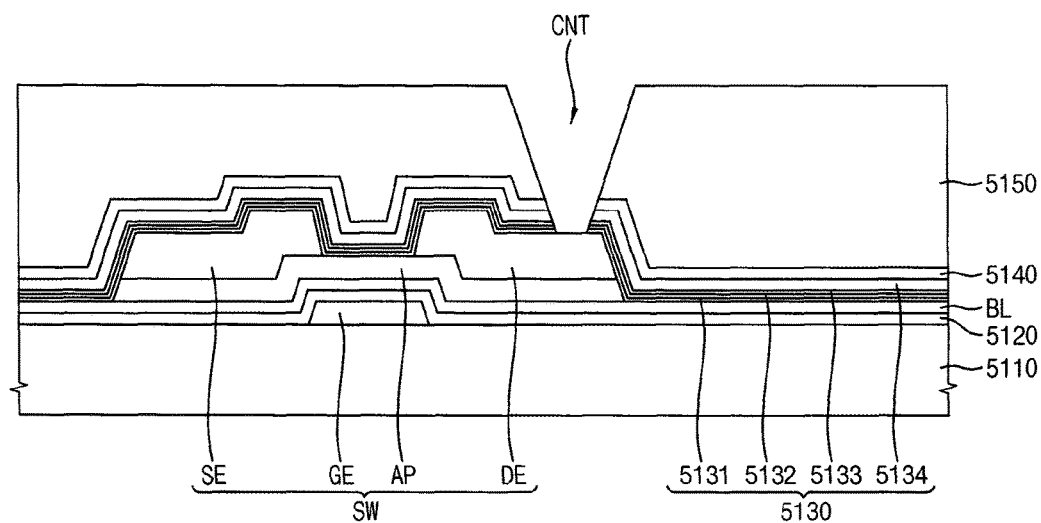

Referring to FIG. 46, an organic layer 5150 is formed on the base substrate 5110 on which the second passivation layer 5140 is formed. Thereafter, a contact hole CNT is formed through the first passivation layer 5130, the second passivation layer 5140 and the organic layer 5150.

The organic layer 5150 planarizes an upper surface of the display substrate 5100 so that problems due to step elevation changes in underlying layers, such as disconnection of a signal line, may be prevented. The organic layer 5150 may be an insulation layer including an organic material. For example, the organic layer 5150 may a color filter layer. When the organic layer 5150 is a color filter layer, the color filter layer may be a color filter layer having any color, such as a red color, a green color, a blue color or a white color.

A pixel electrode PE may be electrically connected to the drain electrode DE. The pixel electrode PE may be electrically connected to the drain electrode DE through the contact hole CNT.

Referring to FIG. 41, a transparent conductive layer is formed on the organic layer 5150 and patterned to form a pixel electrode PE.

The transparent conductive layer may include a transparent conductive material, such as indium tin oxide (ITO) and/or indium zinc oxide (IZO). The pixel electrode PE may be electrically connected to the drain electrode DE through the contact hole CNT.

Since the first sub passivation layer 5131, the second sub passivation layer 5132 and the third sub passivation layer 5133 are formed by plasma treatment using a relatively low electric power, deterioration of the active pattern AP and the source metal pattern may be minimized. In addition, when the first sub passivation layer 5131, the second sub passivation layer 5132 and the third sub passivation layer 5133 include silicon oxide (SiOx) and are formed using a low electric power, $H_2SiOx$ may be generated. Thus, the quantity of hydrogen in first sub passivation layer 5131, the second sub passivation layer 5132 and the third sub passivation layer 5133 may be increased. Accordingly, oxygen may be provided to the active pattern AP, so that carrier may be increased in the active pattern AP.

According to the present exemplary embodiment, the buffer layer is formed by plasma treatment using a relatively low electric power, so that deterioration of the active pattern and the source metal pattern may be minimized. In addition, when the buffer layer includes silicon oxide (SiOx) and is formed using a low electric power, $H_2SiOx$ may be generated. Thus, a quantity of hydrogen in the buffer layer may be increased. Accordingly, oxygen may be provided to the active pattern, so that carriers may be increased therein.

In addition, a thin film transistor substrate according to an exemplary embodiment of the inventive concept further includes a lower buffer layer disposed between the gate insulation layer and the active pattern. The lower buffer layer provides the active pattern with oxygen, so that carrier amounts may be increased in the active pattern.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. Furthermore, different features of the various embodiments, disclosed or otherwise understood, can be mixed and matched in any manner to produce further embodiments within the scope of the invention. The present inventive concept is defined by the following claims, with equivalents of the claims to be included therein.

What is claimed is:

1. A thin film transistor substrate comprising:
   a gate electrode disposed on a base substrate;
   an active pattern overlapping the gate electrode;
   a source metal pattern comprising both a source electrode disposed on the active pattern and a drain electrode spaced apart from the source electrode;
   a buffer layer disposed on the source metal pattern and contacting the active pattern;
   a first passivation layer disposed on the buffer layer; and
   a second passivation layer disposed on the first passivation layer,
   wherein a density of hydrogen in the buffer layer is greater than the density of hydrogen in the first passivation layer and less than the density of hydrogen in the second passivation layer.

2. The thin film transistor substrate of claim 1, wherein the buffer layer comprises at least one of silicon oxide (SiOx), aluminum oxide (AlOx), gallium oxide (GaOx), titanium oxide (TiOx), tantalum oxide (TaOx), manganese oxide (MnOx), silicon oxynitride (SiON), aluminum oxynitride (AlON), and gallium oxynitride (GaON).

3. The thin film transistor substrate of claim 2, wherein the buffer layer comprises:
   a first sub buffer layer contacting the active pattern;
   a second sub buffer layer disposed on the first sub buffer layer; and
   a third sub buffer layer disposed on the second sub buffer layer and contacting the first passivation layer.

4. The thin film transistor substrate of claim 3, wherein the density of hydrogen in the first sub buffer layer is greater than the density of hydrogen in the second sub buffer layer, and the density of hydrogen in the second sub buffer layer is greater than the density of hydrogen in the third sub buffer layer.

5. The thin film transistor substrate of claim 3, wherein the first sub buffer layer, the second sub buffer layer and the third sub buffer layer each comprise the same material.

6. The thin film transistor substrate of claim 3, wherein the first sub buffer layer, the second sub buffer layer, the third sub buffer layer and the first passivation layer each comprise the same material.

7. The thin film transistor substrate of claim 1, further comprising:
   an insulation layer disposed on the gate electrode; and
   a lower buffer layer disposed between the insulation layer and the active pattern.

8. The thin film transistor substrate of claim 7, wherein the density of hydrogen in the lower buffer layer is greater than the density of hydrogen in the first passivation layer.

\* \* \* \* \*